United States Patent
Kikushima et al.

(10) Patent No.: US 6,960,870 B2
(45) Date of Patent: Nov. 1, 2005

(54) PIEZO-ELECTRIC RESONATOR AND MANUFACTURING METHOD THEREOF

(75) Inventors: Masayuki Kikushima, Ina (JP); Yoshio Morita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/045,274

(22) Filed: Jan. 31, 2005

(65) Prior Publication Data

US 2005/0134150 A1   Jun. 23, 2005

Related U.S. Application Data

(60) Division of application No. 10/243,682, filed on Sep. 16, 2002, which is a continuation-in-part of application No. 09/120,806, filed on Jul. 23, 1998, now abandoned.

(30) Foreign Application Priority Data

Jul. 29, 1997  (JP) .................................. 09-203194
Feb. 27, 1998  (JP) .................................. 10-48413

(51) Int. Cl.[7] ............................................ H01L 41/08
(52) U.S. Cl. ..................................................... 310/344
(58) Field of Search ................................ 310/340, 344, 310/348

(56) References Cited

U.S. PATENT DOCUMENTS

| | | |
|---|---|---|
| 2,824,219 A | 2/1958 | Fisher et al. |
| 3,396,287 A * | 8/1968 | Horton ........................ 310/312 |
| 3,931,388 A | 1/1976 | Hafner et al. |
| 3,969,640 A | 7/1976 | Staudte |
| 4,035,673 A | 7/1977 | Ishida et al. |
| 4,110,655 A | 8/1978 | Hata et al. |
| 4,252,839 A | 2/1981 | Wakasugi |
| 4,293,986 A | 10/1981 | Kobayashi et al. |
| 4,405,875 A | 9/1983 | Nagai |
| 4,445,256 A | 5/1984 | Huguenin et al. |
| 4,471,259 A * | 9/1984 | Stoermer et al. ........... 310/353 |
| 4,639,631 A | 1/1987 | Chason et al. |
| 4,652,787 A | 3/1987 | Zingg |
| 5,198,716 A * | 3/1993 | Godshall et al. ............ 310/349 |
| 5,235,237 A | 8/1993 | Leonhardt |
| 5,304,887 A | 4/1994 | Heinecke et al. |
| 5,877,042 A | 3/1999 | Mattson et al. |
| 5,956,054 A | 9/1999 | Hirabayashi et al. |
| 6,037,065 A | 3/2000 | Hajmrle et al. |
| 6,541,897 B2 * | 4/2003 | Endoh ........................ 310/344 |

FOREIGN PATENT DOCUMENTS

| | | |
|---|---|---|
| GB | 2002955 | 2/1979 |
| JP | 50-161349 | 11/1950 |
| JP | 53-96691 | 8/1978 |
| JP | 54-20689 | 2/1979 |
| JP | 54-78692 | 6/1979 |
| JP | 55-92015 | 7/1980 |
| JP | 56-074522 | 6/1981 |

(Continued)

*Primary Examiner*—Mark Budd
(74) *Attorney, Agent, or Firm*—Oliff & Berridge, PLC

(57) ABSTRACT

A compact and thin piezo-electric resonator is provided having a high air-tightness and available at a low cost, in which a piezo-electric resonator element is provided in a housing having a structure which permits adjustment of the frequency after sealing the housing. Further, a surface-mounting type piezo-electric resonator is provided, in which a piezo-electric resonator element is provided in a housing, having a structure which permits frequency adjustment through an opening provided in a base or a lid forming the housing.

7 Claims, 19 Drawing Sheets

FOREIGN PATENT DOCUMENTS

| | | |
|---|---|---|
| JP | 57-53123 | 3/1982 |
| JP | 57-053123 | 3/1982 |
| JP | 57-118415 | 7/1982 |
| JP | 59-85123 | 5/1984 |
| JP | 02-136133 | 5/1990 |
| JP | 03-243010 | 10/1991 |
| JP | 04-035107 | 2/1992 |
| JP | 07-086867 | 3/1995 |
| JP | 07-221589 | 8/1995 |
| JP | 08-293753 | 11/1996 |
| JP | 09-064221 | 7/1997 |
| JP | 10-004152 | 1/1998 |
| JP | 11-312948 | 11/1999 |
| JP | 2000-106515 | 4/2000 |
| JP | 2000-307368 | 11/2000 |
| JP | 2001-292048 | 10/2001 |
| JP | 2002-009577 | 1/2002 |
| JP | 2002-050711 | 2/2002 |
| JP | 2002-190539 | 7/2002 |

\* cited by examiner

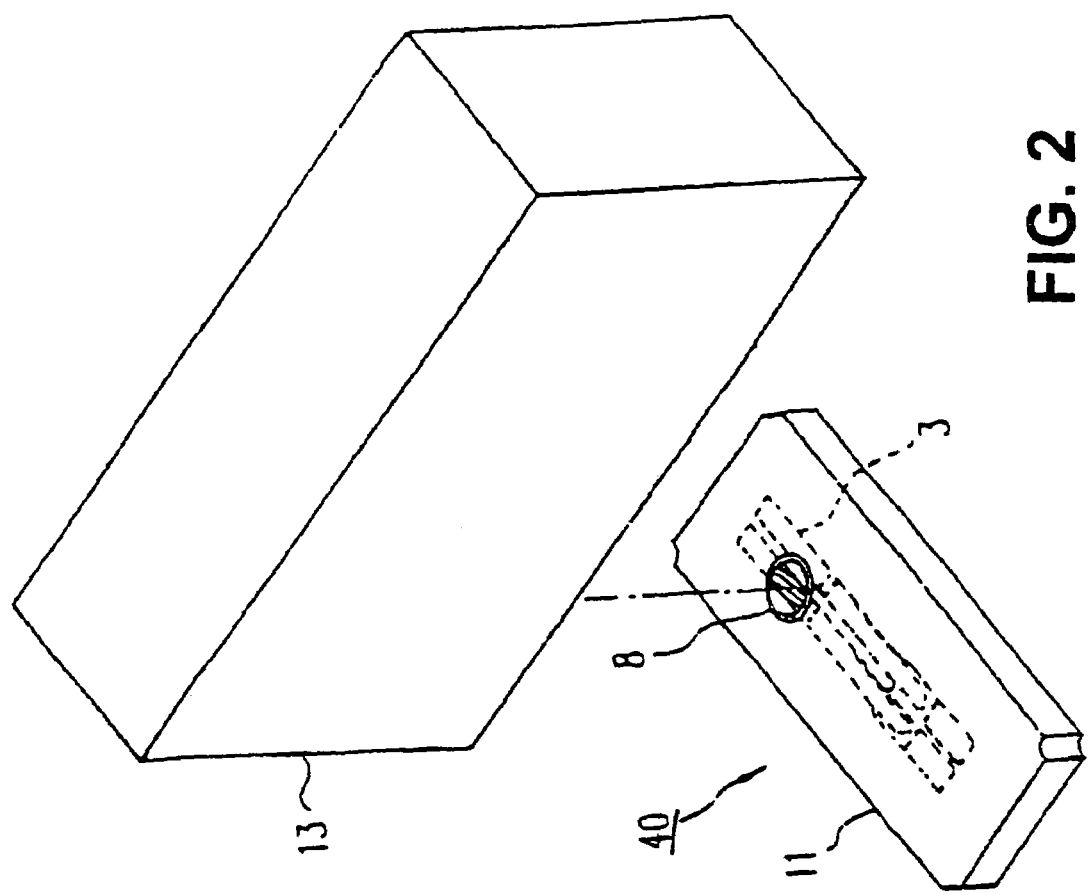

FIG. 25(a)
(Related Art)
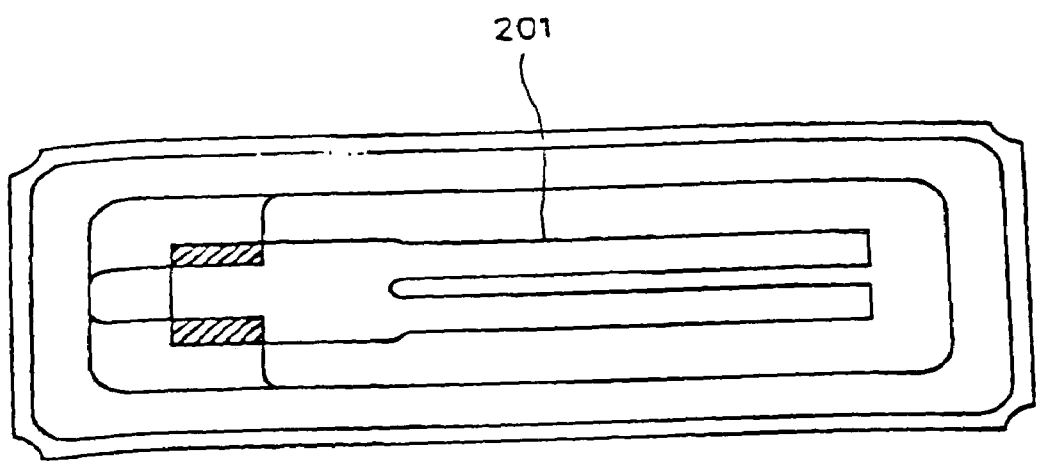
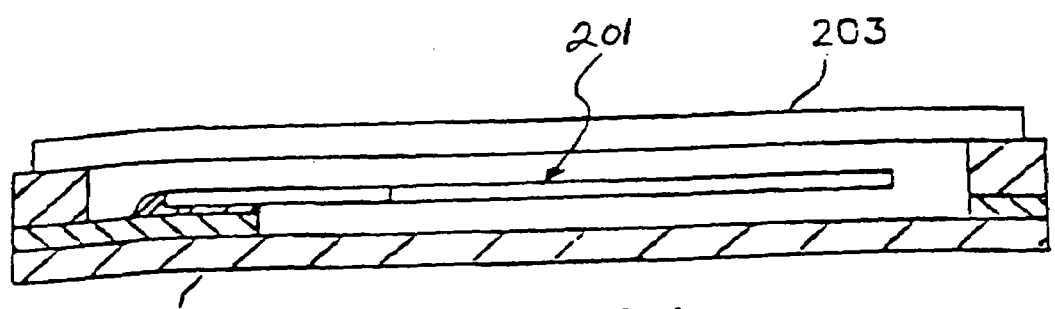
FIG. 25(b)
(Related Art)

PIEZO-ELECTRIC RESONATOR AND MANUFACTURING METHOD THEREOF

CROSS REFERENCE TO RELATED APPLICATIONS

This is a Divisional of U.S. patent application Ser. No. 10/243,682 filed Sep. 16, 2002, which is a Continuation-in-Part of U.S. patent application Ser. No. 09/120,806 filed Jul. 23, 1998 now abandoned, which claims priority under 35 U.S.C. § 119 of Japanese Patent Applications Nos. 09-203194 filed Jul. 29, 1997 and 10-048413 filed Feb. 27, 1998. The entire disclosures of the prior applications are hereby incorporated by reference herein in their entirety.

BACKGROUND OF THE INVENTION

1. Field of Invention

The present invention relates to a piezo-electric resonator having a piezo-electric resonator element provided in a housing, and a manufacturing method thereof.

2. Description of Related Art

There has recently been a remarkable tendency directed toward a smaller and thinner size of mobile communication devices such as an HDD (hard disk drive), a mobile computer, and compact information devices such as an IC card, a portable telephone, car telephone and a paging system. Achievement of a smaller and thinner size is also demanded for piezo-electric devices such as a piezo-electric resonator used in these communication devices. There is simultaneously a requirement for a surface mounting type piezo-electric resonator capable of being mounted on both sides of a circuit board of the device.

An example of a conventional piezo-electric resonator will therefore be described with reference to a low/medium frequency quartz resonator represented by configuration diagrams shown in FIGS. 25(*a*) and 25(*b*) using a tuning fork type quartz resonator as the piezo-electric resonator element. The low/medium frequency quartz resonator having a frequency of 32.768 kHz, a typical frequency for a watch, or of from several ten kHz to several hundred kHz, used for an IC card or a pager.

In the conventional configuration of the quartz resonator shown in FIGS. 25(*a*) and 25(*b*), a quartz resonator element 201 formed from a quartz substrate and having a metal driving electrode formed on the surface thereof is mount-connected with a conductive adhesive to a pedestal of a base 202 formed with a ceramic laminated substrate, and is sealed by a lid 203 formed of a transparent glass material in a vacuum. After sealing, the resonator element is trimmed through the glass lid 203 with a laser or the like to adjust the frequency.

The above-mentioned piezo-electric resonator has a housing composed of a three-layer ceramic base and a glass lid, and is vacuum-sealed. The lid is made of a glass material such as high-quality borosilicate glass so as to permit adjustment of the frequency after sealing.

However, the glass lid requires a high material cost and also a high cost for cutting the lid from a glass substrate into a rectangular shape of the lid at a high accuracy, resulting in a high cost of the piezo-electric resonator. Fine dust produced from the glass lid exerts an adverse effect on properties of the quartz resonator. Further, the base consisting of a three-layer ceramic substrate, and air-tightness between laminated layers poses a problem, which causes deterioration of properties of the resonator element that requires keeping a high vacuum.

SUMMARY OF THE INVENTION

The present invention has an object to solve the problems mentioned above in the conventional art, and to provide a piezo-electric resonator with high-vacuum and high-air-tightness at a low cost.

The present invention provides a piezo-electric resonator consisting of a housing having an opening, and a piezo-electric resonator element provided in the housing, the piezo-electric resonator element being frequency-adjusted by a frequency adjuster from the opening provided in the housing.

The present invention provides a piezo-electric resonator described above, the piezo-electric resonator element being a tuning fork type piezo-electric resonator element having two resonating arms and part of at least one of the two resonating arms being frequency-adjusted by a frequency adjuster.

The present invention provides the piezo-electric resonator described above, the piezo-electric resonator element being a tuning fork type quartz resonator element.

The present invention as provides the piezo-electric resonator described above, the frequency adjuster being a trimming device based on laser beam or electron beam.

The present invention provides the piezo-electric resonator described above, the piezo-electric resonator element being mounted on a base electrode section containing a first single layer and sealed by a lid containing a second single layer.

The present invention provides the piezo-electric resonator described above, the opening provided in the housing being a size not exceeding an exterior size of the tuning fork type piezo-electric resonator element housed therein, and the tuning fork type piezo-electric resonator element being formed so that at least portions of both of the two resonating arms are exposed.

The present invention provides a piezo-electric resonator consisting of a housing having an opening, and a piezo-electric resonator element provided in the housing, the housing containing a ceramic laminated substrate, and the opening provided in the housing being metallized.

The present invention provides a piezo-electric resonator having an opening, and a piezo-electric resonator element provided in the housing, the housing containing ceramic laminated substrate, and an edge portion of the opening and a periphery of the opening being metallized.

The present invention provides a piezo-electric resonator consisting of a housing having an opening, and a piezo-electric resonator element provided in the housing, a metal portion having a high thermal conductivity being formed around the opening provided in the housing.

The present invention provides the piezo-electric resonator described above, the metal portion formed around the opening being of a same material as a metal coating used for metallizing the edge portion and the periphery of the opening.

The present invention provides the piezo-electric resonator described above, the metal portion formed around the opening being connected to a metal coating metallizing the edge portion and the periphery of the opening.

The present invention provides the piezo-electric resonator described above, in the metal coating at the edge portion and the periphery of the opening, an inner peripheral edge portion of the opening being metallized into a greater thickness than other regions around the opening.

The present invention provides the piezo-electric resonator described above, the opening being sealed by heating the metal portion formed around the opening.

The present invention provides the piezo-electric resonator described above, the metal coating being formed to cover regions including an inner peripheral edge of the opening provided in the housing, and a sealing step being accomplished by melting a sealing material applied to the opening.

The invention provides the piezo-electric resonator described above, the housing being sealed by heating a metal portion formed around the opening to melt the sealing material applied to the opening.

The present invention provides the piezo-electric resonator described above, the sealing material for sealing the opening being a metal alloy having a melting point within a range of from 250 to 500° C.

The present invention provides the piezo-electric resonator described above, the sealing material for sealing the opening being any one of an Au—Sn soldering alloy, an Sn soldering alloy and a Pb—Sn soldering alloy and a combination of a plurality thereof.

The present invention provides the piezo-electric resonator described above, the sealing material for sealing the opening being an alloy containing silver (Ag) and copper (Cu).

The present invention provides the piezo-electric resonator described above, the opening provided in the housing being formed into an elliptic shape, and the sealing material for sealing the opening being a spherical metal alloy.

The invention provides the piezo-electric resonator described above, the opening provided in the housing being circular, the sealing material for sealing the opening being a spherical metal alloy, and the sealing material having, before melting, a diameter from 1.1 to 1.7 times a diameter of the opening.

The present invention provides the piezo-electric resonator described above, at least two sealing materials for sealing the opening being used, and the sealing materials being spherical metal alloy.

The present invention provides a manufacturing method for manufacturing a piezo-electric resonator consisting of forming a housing having an opening, providing a piezo-electric resonator element in the housing, and frequency-adjusting a part of the piezo-electric resonator element through the opening provided in the housing.

The present invention provides the manufacturing method for manufacturing a piezo-electric resonator described above, further including vacuum-sealing the opening in a vacuum and forming an air-tight region in which the piezo-electric resonator element is provided and vacuum-sealed, the region being formed from a single layer of a base and a lid.

The present invention provides a manufacturing method for manufacturing a piezo-electric resonator described above, further including setting a sealing material on the opening, and heating the sealing material in a vacuum for vacuum-sealing the opening.

The present invention provides the manufacturing method for manufacturing a piezo-electric resonator described above, further including heating a periphery of the opening in a vacuum for vacuum-sealing the opening.

The present invention provides the manufacturing method for manufacturing a piezo-electric resonator described above, the step of heating the sealing material consisting of providing the housing containing the piezo-electric resonator element in a vacuum chamber, and irradiating a high-temperature optical beam or laser beam from outside the vacuum chamber for heating and melting the sealing material.

The present invention provides the manufacturing method for manufacturing a piezo-electric resonator described above, the step of heating the sealing material consisting of bringing a heating jig into contact with the sealing material and the periphery of the opening for heating and melting the sealing material.

The present invention provides the manufacturing method for manufacturing a piezo-electric resonator described above, further including heating the lid or base in a vacuum at the step of heating the sealing material for vacuum-sealing the opening.

The present invention provides a method of manufacturing a piezoelectric device including a step for mounting a piezoelectric element on a base, a first scaling step for fixing a lid on the base so that the piezoelectric element is packaged by the base and the lid, and a second sealing step for sealing the opening formed in the base or the lid by use of a spherical metal alloy.

The present invention provides the method of manufacturing a piezoelectric device described above, further including heating and melting the spherical metal alloy at the second sealing step.

The present invention provides the method of manufacturing a piezoelectric device described above, further including heating and melting the spherical metal alloy by use of a laser beam or an electron beam at the second sealing step.

The present invention provides the method of manufacturing a piezoelectric device described above, further comprising a step for forming the base by a ceramic material and metallizing an edge portion of the opening and a periphery of the opening.

The present invention provides the method of manufacturing a piezoelectric device described above, the opening being circular and the spherical metal alloy having, before melting, a diameter from 1.1 to 1.7 times a diameter of the opening.

The present invention provides the method of manufacturing a piezoelectric device described above, a spot of the laser beam at a position of the spherical metal alloy has a diameter from 0.8 to 1.5 times a diameter of the spherical metal alloy.

The present invention provides the method of manufacturing a piezoelectric device described above, further comprising a step for mounting an electronic component for oscillating the piezoelectric element on the base.

The present invention provides the method of manufacturing a piezoelectric device described above, the piezoelectric element being a tuning fork type piezoelectric resonator element, an AT cut quartz crystal resonator element, a surface acoustic wave resonator element, a surface acoustic wave filter element or a piezoelectric gyro element.

The present invention provides a method of manufacturing a piezoelectric device including a step for mounting a turning fork type piezoelectric resonator element on a base, the tuning fork type resonator element having a base portion and two resonating arms elongated from the base portion, the base portion mounted on the base, a first sealing step for fixing a lid on the base so that the tuning fork type piezoelectric resonator element is packaged by the base and the lid, a step for trimming a metal layer formed on the resonating arms and adjusting a frequency of the tuning fork type piezoelectric resonator element by use of a laser beam or an electron beam through an opening formed in the base or the lid, and a second sealing step for sealing the opening by use of a spherical metal alloy in a vacuum.

The present invention provides the method of manufacturing a piezoelectric device described above, further including heating and melting the spherical metal alloy at the second sealing step.

The present invention provides the method of manufacturing a piezoelectric device described above, further including heating and melting the spherical metal alloy by use of a laser beam or an electron beam at the second sealing step.

The present invention provides the method of manufacturing a piezoelectric device described above, further comprising a step for forming the base by a ceramic material and metallizing an edge portion of the opening and a periphery of the opening.

The present invention provides the method of manufacturing a piezoelectric device described above, the opening being circular, and the spherical metal alloy having, before melting, a diameter from 1.1 to 1.7 times a diameter of the opening.

The present invention provides the method of manufacturing a piezoelectric device described above, a spot of the laser beam at a position on the spherical metal alloy has a diameter from 0.8 to 1.5 times a diameter of the spherical metal alloy.

BRIEF DESCRIPTION OF THE DRAWINGS

FIG. 1(a) is a schematic plan view of the piezo-electric resonator, and FIG. 1(b) is a schematic front view of the piezo-electric resonator.

FIG. 2 is a schematic view illustrating a frequency adjusting step of the piezo-electric resonator shown in FIGS. 1(a)–(b).

FIG. 7(a) is a schematic plan view of the piezo-electric resonator, and FIG. 7(b) is a schematic sectional front view of the piezo-electric resonator.

FIGS. 25(a)–(b) illustrate the structure of the conventional piezo-electric resonator. FIG. 25(a) is a plan view thereof, and FIG. 25(b) is a schematic sectional front view thereof.

DETAILED DESCRIPTION OF PREFERRED EMBODIMENTS

Embodiments of the piezo-electric resonator of the invention will now be described with reference to the drawings with a 32.768-kHz quartz resonator for a watch using a quartz resonator element of the tuning fork type as an example.

In the following embodiments, the sealing method by use of the spherical metal alloy can be also applied to the piezoelectric device including an AT cut quartz crystal resonator element, a surface acoustic wave resonator element, a surface acoustic wave filter element or a piezoelectric gyro element. Furthermore, the sealing method by use of the spherical metal alloy can be also applied to the piezo-electric device such as a piezoelectric oscillator or a piezo-electric gyro sensor by mounting these piezoelectric elements and the other electronic components (for example, semiconductor IC chip) for oscillating them on the base. The piezoelectric device includes a piezoelectric resonator, a piezoelectric oscillator, a piezoelectric filter, a piezoelectric gyro sensor and so on.

First Embodiment

Figure 1A:
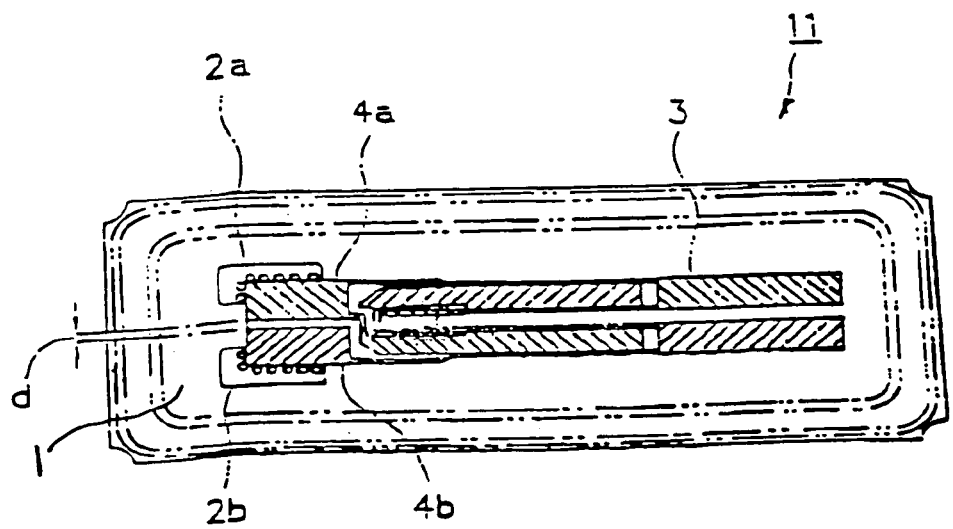
FIGS. 1(a)–(b) illustrate the structure of a piezo-electric resonator of a first embodiment of the invention.
Figure 1B:
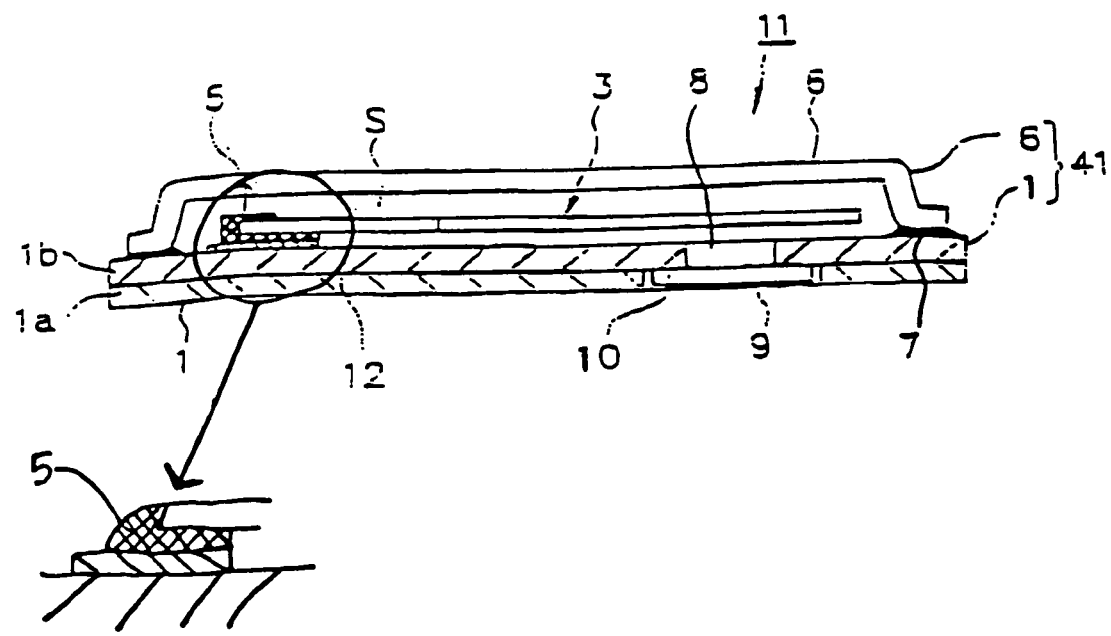

FIG. 1(a) is a plan view of the piezo-electric resonator 11 of this embodiment, and FIG. 1(b) is a front view of the piezo-electric resonator 11.

As shown in these drawings, metallized electrode sections 2a and 2b having the surface plated with Ni and Au are formed at an interval d on a base 1, the base being formed by laminating two ceramic substrates 1a and 1b. Electrode sections 4a and 4b of, for example, a tuning fork type quartz resonator element 3, serving as piezo-electric resonator elements and having driving metal electrodes formed on the surfaces thereof are aligned with, and mounted on, the electrode sections 2a and 2b of this base 1. The electrode sections 4a and 4b and electrode sections 2a and 2b are electrically connected and secured with a conductive adhesive 5. Then, the metal lid 6 is aligned with the base 1. A first sealing step is carried out by melting a sealing material 7 using a beam irradiating device serving as heater such as a laser device or an electron beam device, thus sealing the quartz resonator element 3 in a housing 41 consisting of the base 1 and the lid 6.

An opening 8 communicating between the inside and the outside of the housing described later is formed in the bottom of the base 1 as shown in FIG. 1(b).

FIG. 2 illustrates a step for the following fabrication with the back surface of the base 1 positioned upward.

Frequency adjustment is carried out by trimming the metal electrode portion forming a part of the tuning fork type quartz resonator element 3 through the circular opening 8 provided in the base 1 as shown in FIG. 2, using a frequency adjuster 13 such as a laser device or an electron beam device.

Finally, a small sealing element 9 made of a metal or the like as shown in FIG. 1(b) is mounted on the opening section 8, and a second vacuum-sealing step is performed by melting a sealing material 10 using a laser device or an electron beam device, as in the first sealing, in a vacuum.

A compact and thin quartz resonator 11 of the surface mounting housing is thus completed.

The vacuum region S having a built-in tuning fork type quartz resonator element 3 is thus composed of a single layer portion 12 (upper substrate 1b) of the base 1 and a lid 6 made of a metal and subjected to drawing, and has therefore a very high air-tightness. That is, because the vacuum region S is partitioned only by the single layer portion 12 of the base 1 and the drawn metal lid 6, there is no seam from the plurality of ceramic substrates composing the base within the vacuum region S, thus permitting maintenance of air-tightness.

Figure 3:
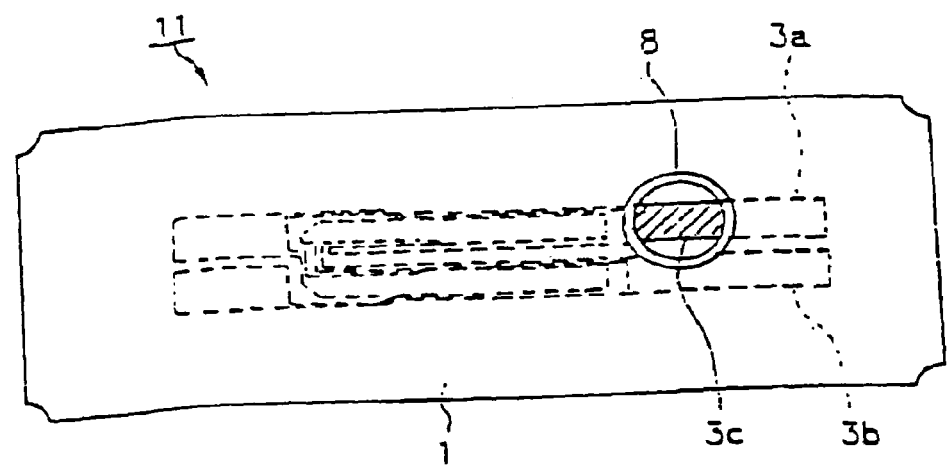
FIG. 3 is a schematic rear view illustrating the piezo-electric resonator shown in FIGS. 1(a)–(b).

FIG. 3 illustrates the structure on the back side of the quartz resonator 11 in the embodiment of the invention, and represents the relationship between the portion trimmed by laser fabrication or by electric beam fabrication carried out for adjusting the frequency of the above-mentioned tuning fork type quartz resonator element 3.

The quartz resonator element 3 is formed through a photolithographic fabrication from a quartz substrate into the same exterior shape in which a plurality of resonating arms are arranged. Further, a metal film serving as an electrode of a material such as Cr+Au or the like (for example, formed by sputtering Au onto a Cr film) is formed on the surface of each resonating arm. The frequency is reduced at a certain rate through a weighting effect by further accurately forming a thin film of a metal such as Au or Ag onto a part of this metal film.

Then, the quartz resonator element 3 is broken off from the quartz substrate, and mounted on the base 1 and sealed with the lid 6 as shown in FIG. 1(b). The resonance frequency of the quartz resonator element 3 varies under the effect of the heating caused by fabrication processes such as mounting and sealing, production stress, and an out-gas produced from the sealing material. It is therefore necessary to conduct frequency adjustment after sealing, and frequency adjustment should be made at a high accuracy.

For this purpose, as shown in FIG. 3, an opening 8 is formed on the back side of the base 1 so that a frequency adjusting section 3c of at least one resonating arm 3a from among the two resonating arms 3a and 3b produced from branching of the quartz resonator element 3 can be fabricated with a laser beam or an electron beam through the opening 8. More specifically, the opening 8 is positioned so as to expose a part of the one resonating arm 3a of the two resonating arms 3a and 3b of the tuning fork type quartz resonator element 3 as a frequency adjusting section 3c. The laser beam or the electron beam melts the metal film consisting of Au or Ag of the frequency adjusting section 3c of the resonating arm 3a through the opening 8, and performs frequency adjustment so as to achieve a target frequency (for example, 32.768 kHz) by reducing the weight of the frequency adjusting section 3c and increasing the frequency.

A small sealing element 9 made of a metal or the like is mounted on the opening section 8 as shown in FIG. 1(b), and a sealing material 10 is melted by means of a laser device or an electron beam device, thereby conducting vacuum-sealing.

Since the only necessary operation is sealing the opening 8 having a size that permits fabrication of only the frequency adjusting section 3c of at least one resonating arm 3a as described above, sealing exerts only a very slight effect on the frequency.

Second Embodiment

Figure 4:
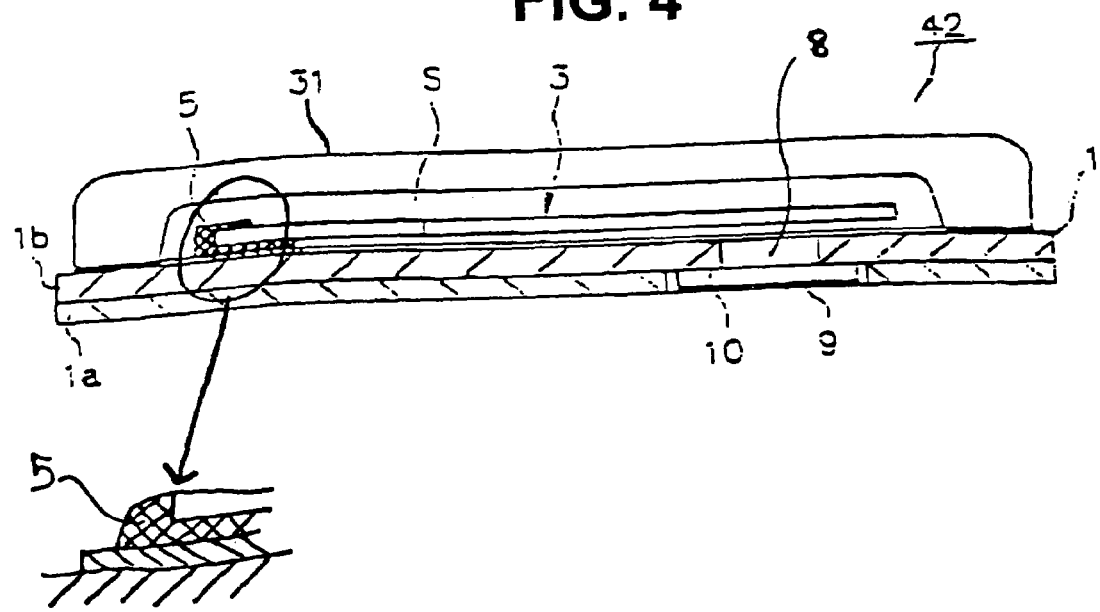
FIG. 4 is a schematic sectional front view illustrating a piezo-electric resonator of a second embodiment of the invention.

FIG. 4 illustrates a piezo-electric resonator 42 of another embodiment of the invention. The components of this piezo-electric resonator 42 corresponding to those in the first embodiment are assigned the same reference numerals, and description which would be a duplication is omitted here. The piezo-electric resonator 42 is different from that in the first embodiment in that a ceramic lid 31 is used in place of the metal lid 6 shown in FIG. 1(b). The piezo-electric resonator 42 of the second embodiment can therefore bring about the same advantages as those in the first embodiment.

Third Embodiment

Figure 5:
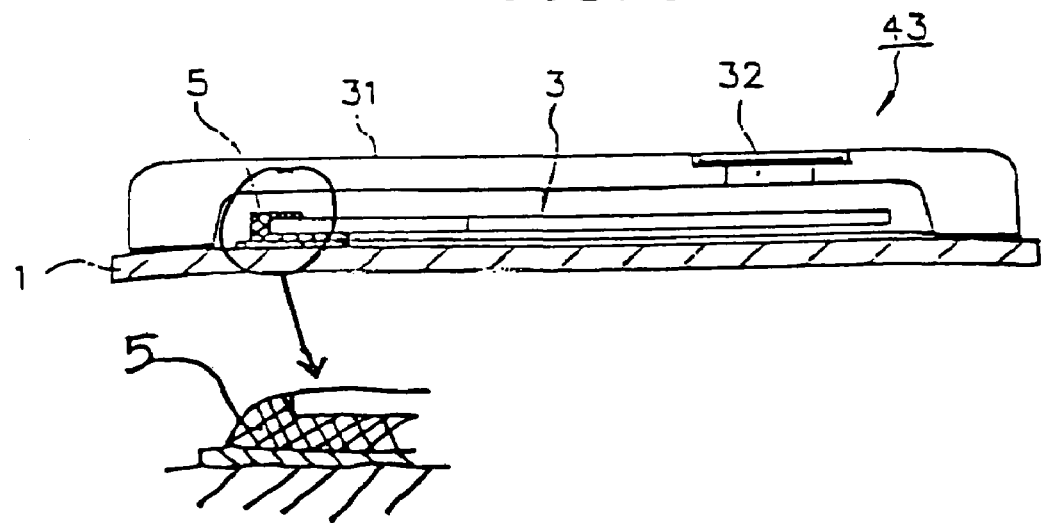
FIG. 5 is a schematic sectional front view illustrating a piezo-electric resonator of a third embodiment of the invention.

FIG. 5 illustrates a piezo-electric resonator 43 of a further embodiment of the invention. The components of this piezo-electric resonator 43 corresponding to those in the second embodiment are assigned the same reference numerals, and description which would lead to duplication is omitted here. The piezo-electric resonator 43 is different from that in the second embodiment in that an opening 32 is formed in the lid 31 shown in FIG. 4. The piezo-electric resonator 43 of the third embodiment can therefore bring about the same advantages as those in the first and the second embodiments.

Fourth Embodiment

Figure 6:
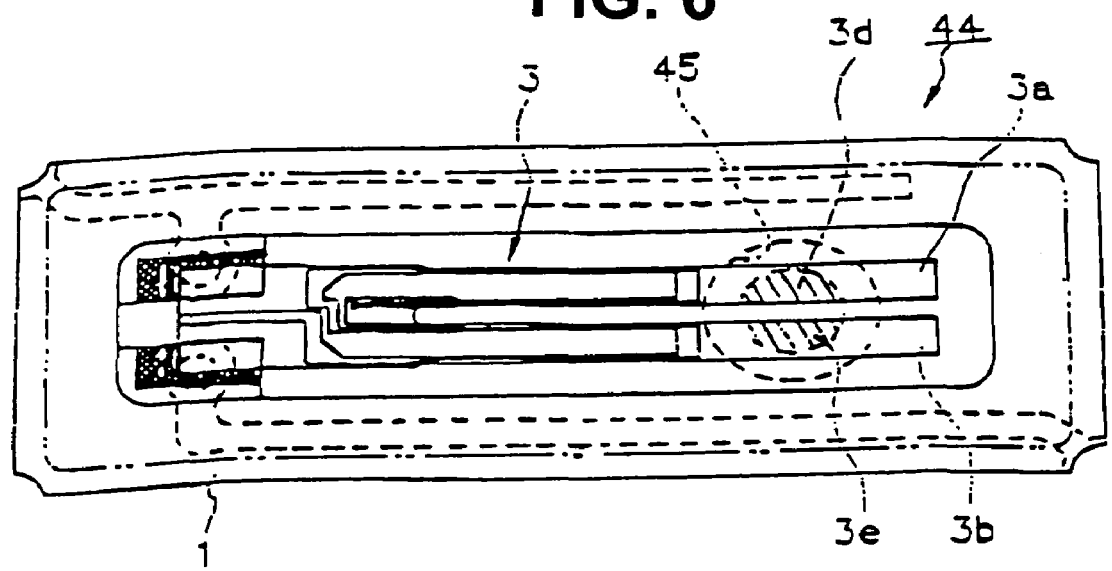
FIG. 6 is a schematic rear view illustrating a piezo-electric resonator of a fourth embodiment of the invention.

FIG. 6 illustrates a fourth embodiment of the invention. FIG. 6 is a view corresponding to FIG. 3 of a piezo-electric resonator 44, as viewed from the bottom of the base 1.

In FIG. 6, the components corresponding to those in the first embodiment are assigned the same reference numerals, and description which would result in duplication is omitted here. An opening 45 is provided in the base 1. The opening 45 is positioned so that portions of the two resonating arms 3a and 3b of a tuning fork type quartz resonator element 3 in a housing are exposed as frequency adjusting sections 3d and 3e, respectively. The opening 45 has a size not exceeding the exterior shape of the tuning fork type quartz resonator element 3.

The laser beam or the electron beam irradiated as a frequency adjuster through the opening 45 melts the film of metal such as Au or Ag of the frequency adjusting sections 3d and 3e of the individual resonating arms 3a and 3b, reduces the weight of the frequency adjusting sections 3d and 3e, and increases the frequency, thereby adjusting the frequency so as to achieve a target frequency (for example, 32.768 kHz). In the fourth embodiment, therefore, the weight can be reduced in a good balance between the individual resonating arms 3a and 3b. Apart from the above-mentioned advantage, the piezo-electric resonator 44 provides the same advantages as those in the first embodiment.

In the foregoing embodiments, the sealing material 7 and 10 may consist of an Au—Sn, Pb—Sn or Ag containing metal material or an organic adhesive, in a clad or preformed material.

According to the above-mentioned configuration, the first sealing step and the frequency adjusting step can be commonly carried out with the second sealing step in a laser device or an electron beam device, thus making it possible to achieve an integrated fabrication in a single device.

The shape of the base 1 or the lid 6 of ceramics for fabrication may be a single product or a plate having a plurality of products arranged thereon.

By using ceramics or a metal which is less expensive than high-quality glass for components, there is available a compact and thin quartz resonator having dimensions of 5 mm long×2 mm wide×0.8 mm thick is available at a low cost.

A fifth embodiment of the piezo-electric resonator of the invention will now be described with reference to the drawings taking a 32.768 kHz quartz resonator for a watch using a tuning fork type quartz piezo-electric resonator element as an example.

Fifth Embodiment

Figure 7A:
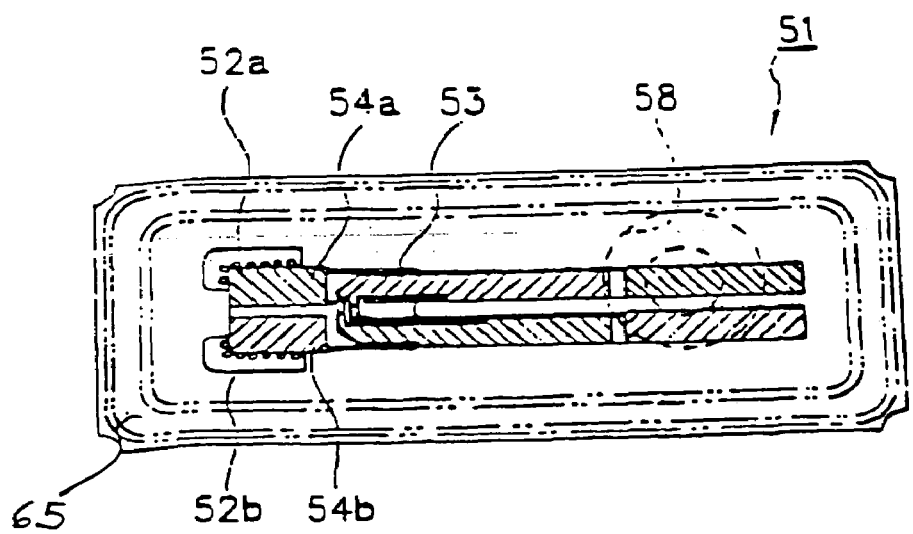
FIGS. 7(a)–(b) illustrate the structure of a piezo-electric resonator of a fifth embodiment of the invention.
Figure 7B:
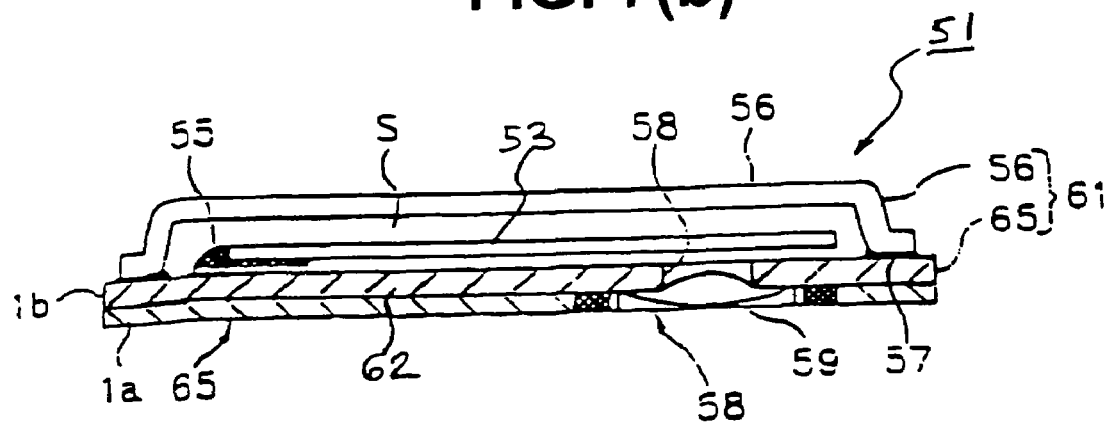

FIG. 7(a) is a plan view of a piezo-electric resonator 51 of the embodiment, and FIG. 7(b) is a front view of the piezo-electric resonator 51.

As shown in these drawings, a base 65 having two laminated ceramic substrates 1a and 1b is provided with a metal such as W (tungsten), and Ni or Au-plated electrodes 52a and 52b on the surface thereof. Electrodes 54a and 54b of the tuning fork type quartz resonator 53 having a metal driving electrode formed on the surface thereof are aligned with, and mounted on, the electrodes 52a and 52b. The electrodes 54a and 54b and the electrodes 52a and 52b are electrically connected and fixed with a conductive adhesive 55. Then, a metal lid 56 is aligned with the base 65, and a first sealing step is performed by melting a sealing material 57 by means of a laser device or an electron beam device. The quartz resonator element 53 is thus sealed in a housing 61 consisting of the base 65 and the lid 56.

An opening 58 providing communication between the inside and the outside of the housing described later is formed in the bottom of the base 65, as shown in FIG. 7(b).

Figure 8:
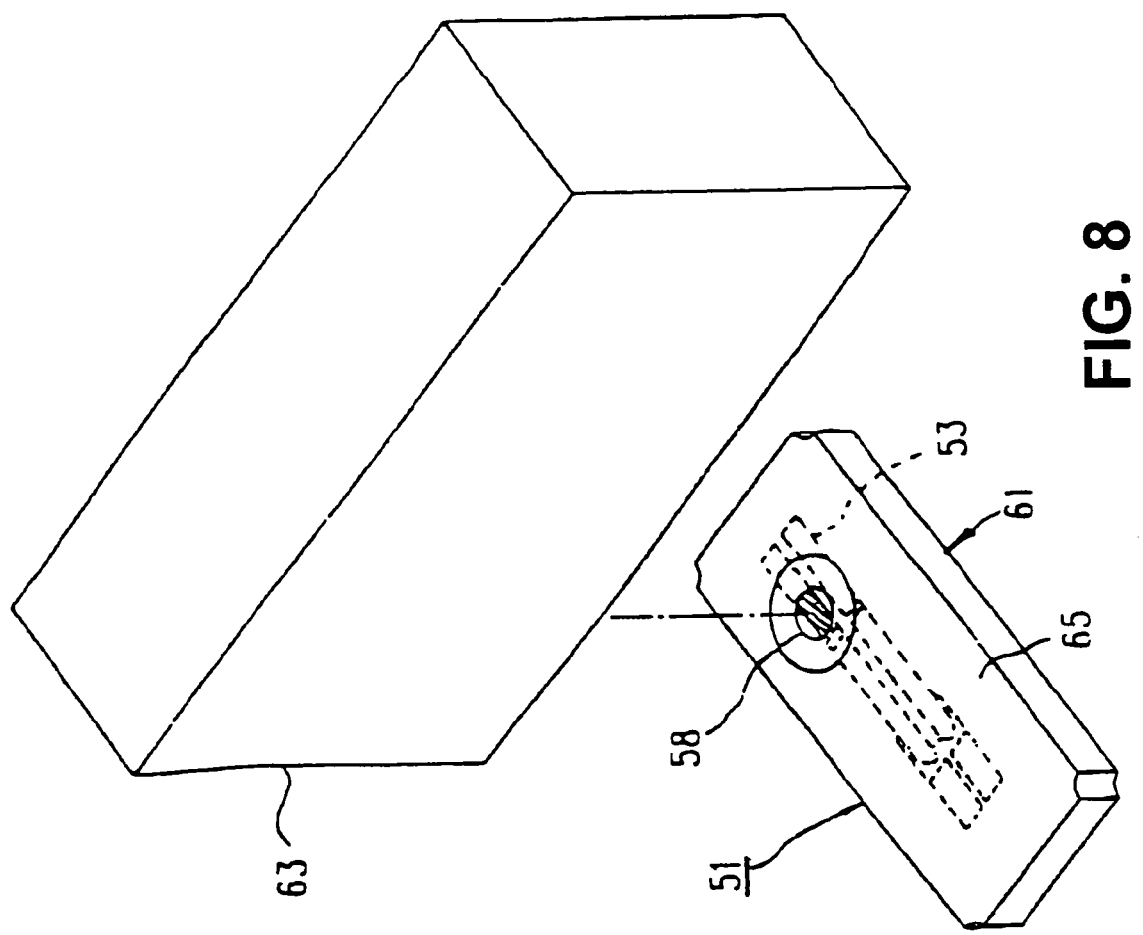
FIG. 8 is a schematic view illustrating a frequency adjusting step of the piezo-electric resonator shown in FIGS. 7(a)–(b).

Further, the frequency is adjusted by trimming partial metal electrode portions of the tuning fork type quartz resonator element 53 by means of the laser device or the electron beam device 63 serving as a frequency adjuster through the circular or elliptical opening 58 provided in the base 65 as shown in FIG. 8.

Finally, a second vacuum-sealing step is conducted by mounting, for example, a spherical sealing material 59 formed from an Au—Sn soldering or a high-melting-point Pb—Sn soldering material such as a 9:1 solder serving as the sealing material on the opening section 58, and melting the sealing material 59 in a vacuum by means of a batch-type vacuum-sealing device, a laser device, or an electron beam device. This second sealing step will be described later further in detail.

As the foregoing, small and thin surface mounting housing type quartz resonator 51 is completed.

As described above, the vacuum region incorporating the tuning fork type quartz resonator element 53, which consists of a single layer portion 62 (upper substrate 1b) of the base 65, and the drawing-fabricated metal lid 56, has a very high air-tightness. That is, because the vacuum region S is partitioned only with the single layer portion 62 of the base 65 and the drawn metal lid 56, there is no seam from the plurality of ceramic substrates composing the base, for example, in this vacuum region S, thus making it easy to maintain a high air-tightness.

The above-mentioned sealing material 59 is made of a metal alloy, and may consist of, apart from the above materials, an Sn soldering material, an alloy of silver (AG) or copper (Cu), or a metal brazing material. The shape of this sealing material 59 will further be described later.

Figure 9:
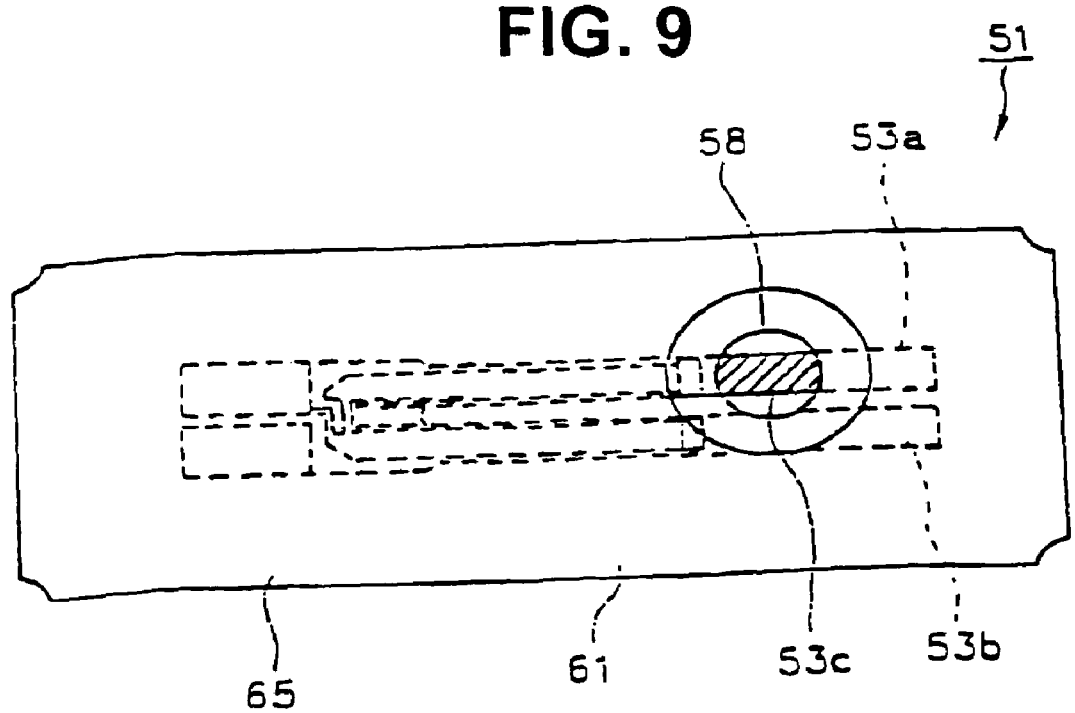
FIG. 9 is a schematic rear view of the piezo-electric resonator shown in FIGS. 7(a)–(b).

FIG. 9 is a structural view on the back of the quartz resonator 51 of this embodiment, illustrating the relationship between the portion trimmed by laser fabrication or electron beam fabrication of the resonator element 53 consisting of resonating arms 53a and 53b, and the opening 58.

The quartz resonator element 53 of this embodiment is formed through a photolithographic fabrication in a state in which a plurality of elements are arranged on a quartz substrate, and a film of metals such as Cr+Au (for example, sputtering Au on a Cr film) is formed as an electrode. A thin film of a metal such as Au or Ag is accurately formed further on a part of this metal film, to reduce the frequency at a certain rate under the weight effect.

Then, the quartz resonator element 53 is broken off the quartz substrate, mounted on the base 65 shown in FIGS. 7(a)–(b), and sealed with the lid 56. The resonance frequency of the quartz resonator element 53 varies under the effect of the heating caused by the mounting and sealing fabrication steps, the resulting production of stress, or a gas produced from the conductive adhesive 55 or the sealing material 57. It is therefore necessary to adjust the frequency after sealing, and frequency adjustment must be carried out accurately.

As shown in FIG. 9, the opening 58 is formed on the back of the base 65 so as to permit fabrication of the frequency adjusting section 53c of at least one resonating arm 53a of the quartz resonator element 53 by a laser beam or an electron beam through the opening 58. The laser beam or the electron beam irradiated through the opening 58 melts the film of the metal such as Au or Ag of the frequency adjusting section 53c of the resonating arm 53a, reduces the weight of the frequency adjusting section 53c, thereby increasing and adjusting the frequency so as to achieve a target frequency (for example, 32.768 kHz).

Vacuum-sealing is carried out by mounting the sealing material 59 on the opening section 58 and melting the sealing material 59 using a vacuum-sealing device, a laser device or an electron beam device.

Since the only necessary operation is sealing the opening 58 having a size that permits fabrication of just only the frequency adjusting section 53c of at least one resonating arm 53a as described above, there is only a very slight negative effect of sealing to the frequency.

The above mentioned second sealing process of mounting the metal alloy serving as the sealing material on the opening section 58 and performing vacuum-sealing will now be described further in detail.

Figure 10A:
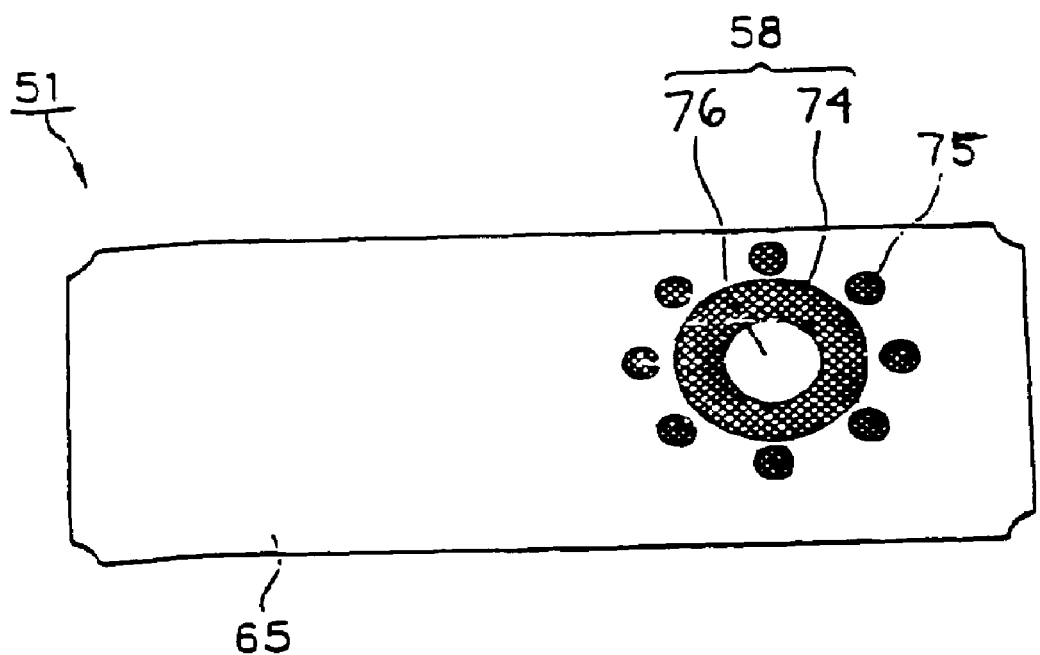
FIG. 10(a) illustrates an opening periphery on the back of the piezo-electric resonator shown in FIGS. 7(a)–(b).
Figure 10B:
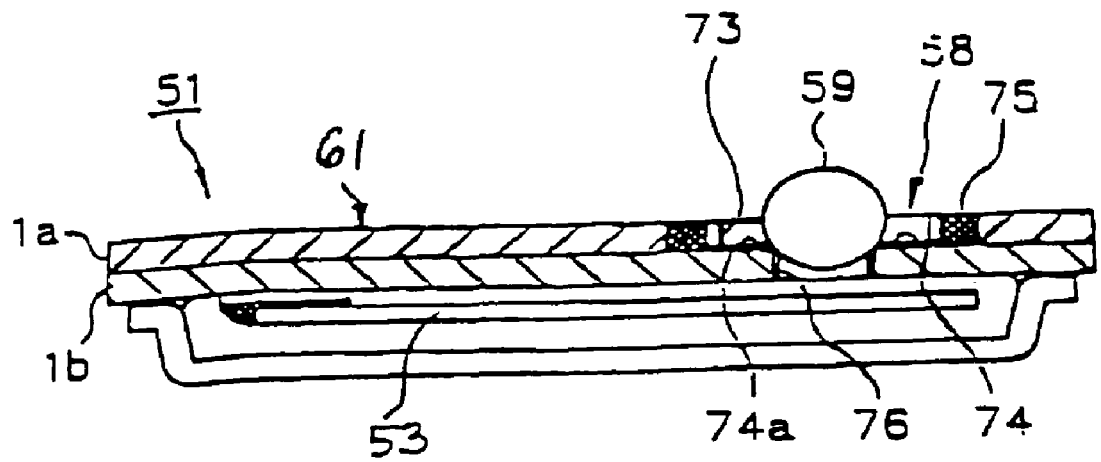
FIG. 10(b) is a schematic sectional front view of the piezo-electric resonator shown in FIGS. 7(a)–(b).

FIG. 10(a) illustrates only the opening section 58 when viewing the piezo-electric resonator 51 from the back of the base 65. FIG. 10(b) is a sectional front view of the piezo-electric resonator 51.

As shown in FIGS. 10(a) and 10(b), the opening section 58 consisting of a throughhole 76 having a diameter of 0.3 mm and a step 74 having a diameter of 0.6 mm is formed in the base 65. That is, the throughhole 73 is formed in the first substrate 1a composing the base 65, and another through-hole 76 smaller than the throughhole 73 is formed in the second substrate 1b, thus forming the step 74 between the throughholes 73 and 76.

A metal coating 74a metallized with W (tungsten) and plated with Ni and Au on the surface is formed on the surface of the step 74, similar to forming the electrodes 52a and 52b on the base 65. As a result, the metal coating 74a is arranged around the opening 58 provided in the housing 61. It is therefore possible to efficiently transfer heat up to the sealed portion by heating this portion, and to achieve a very high degree of vacuum.

A metal portion 75 which is the metallized portion having a high thermal conductivity composed by forming a plurality of elements of W (tungsten), for example, each having a diameter within a range of from 0.2 to 0.25 mm is provided around the opening section 58. The metal portion 75 is electrically connected to the metal coating 74a of the step 74. As a result, it is possible to directly heat through the opening section 58 formed of fine holes by heating the metal portion 75 formed around the opening section 58 as described later. It is therefore possible to instantaneously accomplish vacuum-sealing of a high reliability. Because the heat is not directly conducted to portions other than the sealed portion, heat does not affect particularly the mounting portion of the piezo-electric resonator element 53, and there is available a piezo-electric resonator of a high precision free from frequency deviation after sealing.

Then, the quartz resonator 51 after frequency adjustment is set as shown in FIG. 10(b) on a batch type vacuum-sealing device not shown, and a metal member serving as the sealing material 59 is set.

Figure 11:
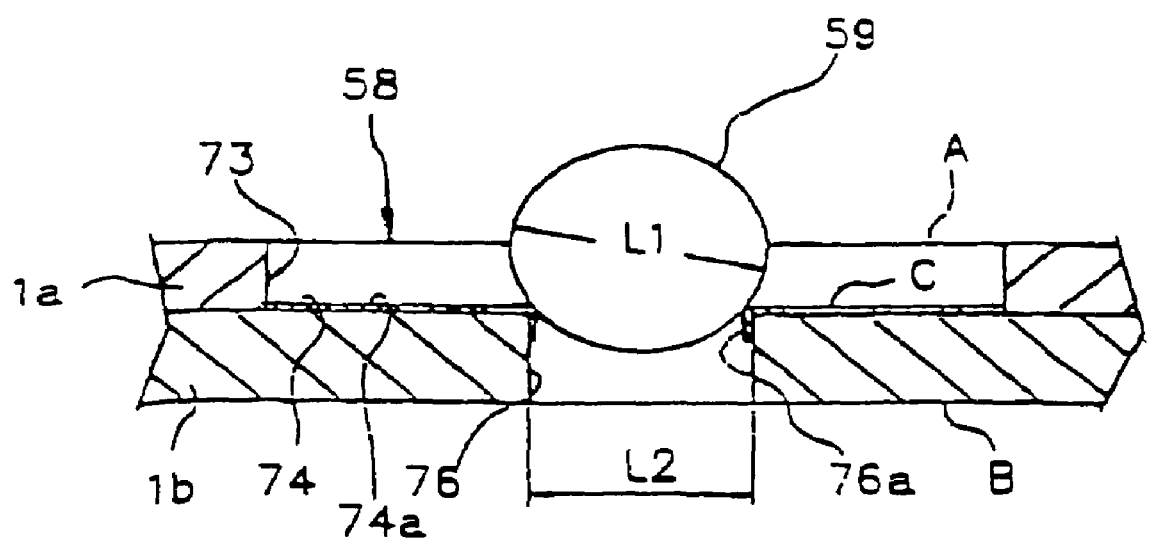
FIG. 11 is an schematic enlarged view of the opening section of the piezo-electric resonator shown in FIGS. 7(a)–(b) as viewed from a side.

FIG. 11 is an enlarged sectional view illustrating the sealing material 59.

In FIG. 11, the sealing material 59 is a spherical metal alloy having, for example, a diameter of 0.35 mm, formed of an Au—Sn soldering material or a high-melting-point Pb—Sn soldering material such as 9:1 solder. As a sealing material 59, a metal alloy having a melting point within a range of from 250 to 500° C. is easy to handle, or apart from the above-mentioned ones, an Sn soldering material, an alloy of silver (Ag) or copper (Cu), or a metal brazing material may be employed.

By using such a sealing material 59, it is possible to accomplish sealing at a low temperature and to instantaneously complete highly reliable vacuum-sealing. Because the sealing material consists of a very slight spherical(ball-shaped) alloy having a diameter of from 0.3 to 0.4 mm, fabrication of the sealing material is easy and manufacturing is possible at a low cost.

The shape of the hole of the opening section 58 is preferably circular or elliptic. When the shape of the hole is elliptic, for example, a plurality of sealing materials 59 may simultaneously be applied.

When a spherical sealing material 59 is used, as shown in FIG. 11, assuming that the sealing material 59 has a diameter L1 and the throughhole 76 has a diameter L2, L1 should preferably be 1.1 times to 1.7 times as large as L2. When L1 is smaller than this range, the sealing material 59 may drop into the housing 61. When L1 is larger than this range, it largely comes off the opening 58. Appropriate heating operation may be prevented by an excessively increased thermal capacity of the sealing material 59, and this leads to a higher material cost.

It is therefore desirable to determine the coated area of the metal coating portion 74a on the surface of the step 74 so that molten metal of the melted sealing material 59 does not come off the area A or the area B in FIG. 11. If the molten metal comes off the area A, there occurs difficulty in mounting the piezo-electric resonator 51 on a substrate or the like. If the molten metal comes off the area B, it may come into contact with the piezo-electric resonator element 53 in the housing 61 and this may lead to short circuit. As a result, the metal coating 74a is located around the through-hole 76 of the opening section 58 (area C) and at the various places. More specifically, in FIG. 11, the metal coating 74a formed around the opening 58 has an extension 76a covering the inner peripheral edge in addition to the portion surrounding the throughhole 76. As described later, therefore, the metal melted upon heating and melting the sealing material 59 adheres to the extension 76a, thus permitting improvement of the sealing effect. In this case, it is desirable limit the extension 76a within the inner peripheral edge of the throughhole 76 to avoid reaching the opposite side of the hole. If the extension 76a will reach the opposite side of the hole, in the melting step of the sealing material 59, the molten metal may reach inside of the housing 61. The extension 76a should therefore preferably be set within a range of from ⅓ to ½ of the depth of the throughhole 76.

Figure 12:
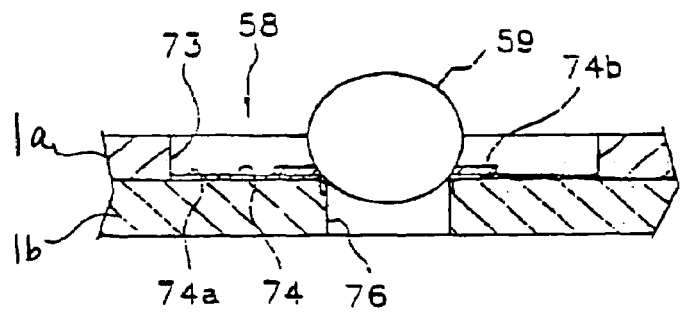
FIG. 12 is a schematic enlarged view of a variant of the opening section of the piezo-electric resonator shown in FIGS. 7(a)–(b) as viewed from a side.

Further, as shown in FIG. 12, a thick film coating portion 74b having a greater thickness than the periphery thereof should preferably be provided in the peripheral region of the metal coating 74a near the throughhole 76. As a result, when the sealing material 59 is heated and melted, wettability with the molten metal is improved, leading to an improvement of the sealing effect.

After applying the sealing material 59 to the opening section 58, the metal portion 75 arranged around the opening 58 (shown in FIG. 10) is heated by a tip of a heater or the like, and heat conduction therefrom heats the step 74, thus further heating and melting the sealing material 59. The molten sealing-material 59 metallizes the step 74, and the hole 76 is simultaneously sealed to complete the second vacuum-sealing process.

A second vacuum-sealing device for achieving the second sealing process will be described in detail with reference to FIG. 13.

Figure 13:
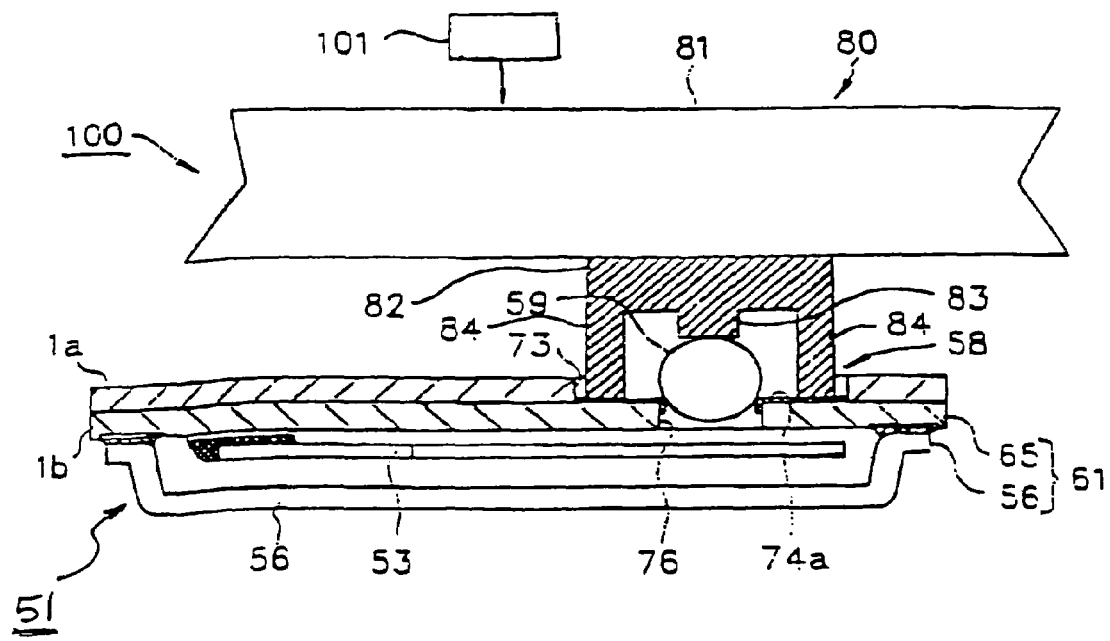
FIG. 13 is a descriptive view illustrating an example of a second sealing step of the piezo-electric resonator shown in FIGS. 7(a)–(b).

In FIG. 13, a vacuum-sealing device 100 includes a heat source 101, and a heating jig 80 having a heat conductor 81 and a contact jig 82. The heat conductor 81 is connected to the heat source 101, and a contact jig 82 (first heater) is attached to the heat conductor 81 to ensure heat conduction.

The heating jig 80 is composed of the heat conductor 81 and the contact jig 82. The contact jig 82 may be attached to a plurality of heat conductors 81 at prescribed intervals. The heat conductor 81 itself may contain a heat source such as an electric heater (carbon heater or like), or may be connected to the heat source 101. The heating jig 80 is driven by a driving device such as a triaxial robot movable in the horizontal XY direction and in the vertical Z direction not shown.

The contact jig 82 has a first pin 83 arranged near the center so as to come into contact with the sealing material 59 when the jig is located on the opening 58 as shown in FIG. 13, and second pins 84 arranged around the first pin 83 so as to come into contact with the upper surface of the metal coating 74a.

Both the heating jig 80 and the housing 61 are arranged in a vacuum, and the heating jig 80 is positioned relative to the opening 58. At least the portion of the contact jig 82 is lowered, and as shown in FIG. 13, the first pin 83 is brought into contact with the sealing material 59. The second pins 84 are simultaneously brought into contact with the metal coating portion 74a. At this point, the buried metal portion 75 not shown in FIG. 13 may also be brought into contact with the second pins 84.

Then, heat is conducted from a heat source such as an electric heater to the heat conductor 81, and further conducted to the sealing material 59 and the metal coating portion 74a via the contact jig 82. When the metal portion 75 is provided as described above, heat is conducted also to the metal portion 75.

Figure 20:
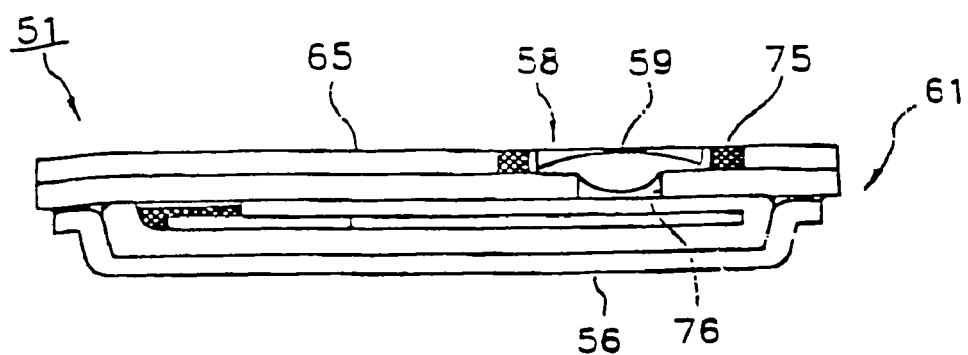
FIG. 20 is a schematic sectional front view illustrating the sealing state of the opening section of the piezo-electric resonator shown in FIGS. 7(a)–(b).

As a result, heat is conducted to the sealing material 59 not only from the first pin 83, but also from the metal coating portion 74a and the metal portion 75, and is thus very efficiently heated and melted. As shown in FIG. 20, the second sealing operation is carried out in a vacuum by closing the throughhole 76 of the opening section 58.

FIG. 20 is a sectional view of the opening section 58 after sealing, in which the diameter of the sealing material 59 is set so that the sealing material 59 does not project from the back of the housing 61.

Regarding the vacuum profile of the vacuum-sealing device and the profile of heating temperature of the above-mentioned heater serving as the heat source, setting is made so that a sufficiently high degree of vacuum is reached in the housing of the piezo-electric resonator 51 prior to complete melting of the sealing material 59.

Figure 14:
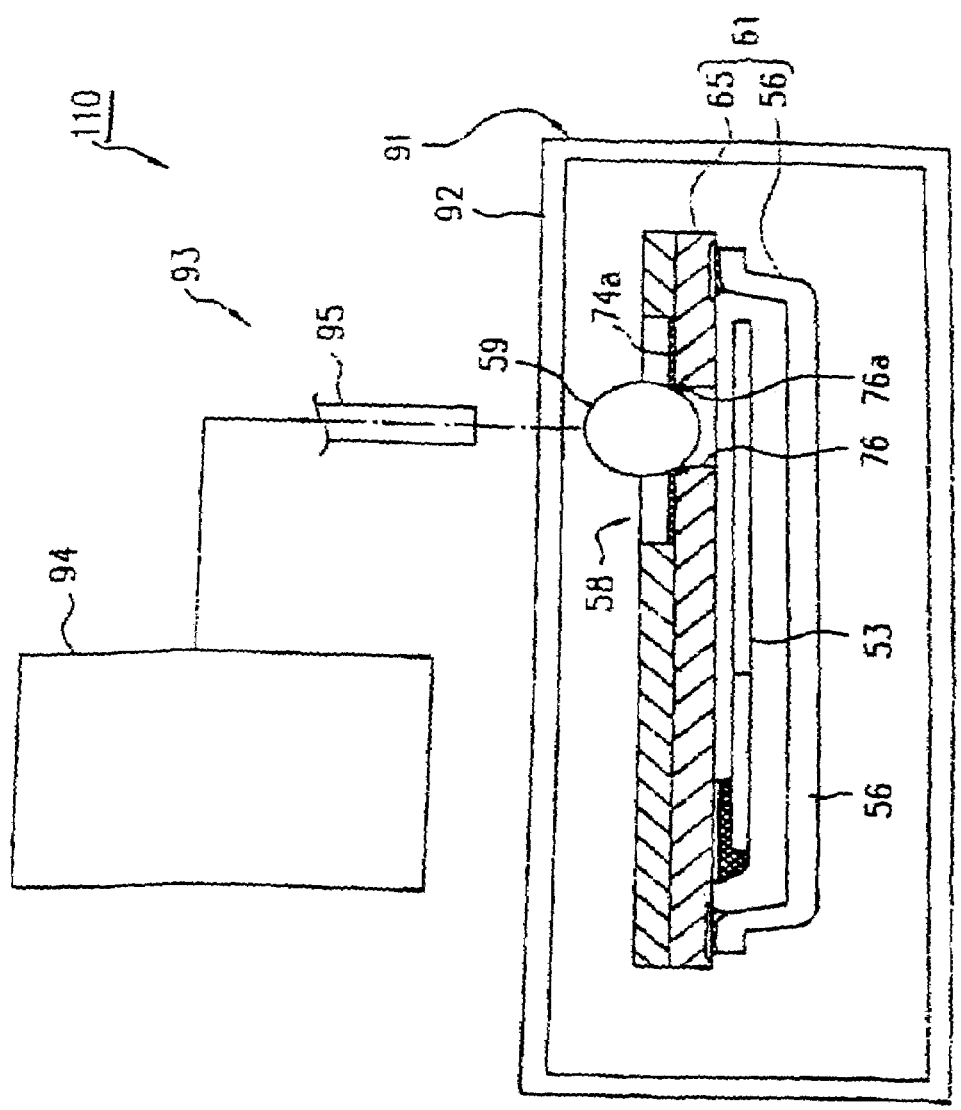
FIG. 14 is a descriptive view illustrating another example of the second sealing step of the piezo-electric resonator shown in FIGS. 7(a)–(b).

FIG. 14 illustrates another technique for the second sealing fabrication.

As shown in FIG. 14, the vacuum-sealing device 110 provides a vacuum chamber 91 and a heater 93. The housing 61 is housed in the vacuum chamber 91. In this state, the interior of the vacuum chamber 91 keeps a high degree of vacuum.

A partial partition or a-cover 92 shown in FIG. 14 of the vacuum chamber 91 is transparent. The opening 58 of the housing 61 is arranged and housed so as to be opposed to the cover 92 side.

In contrast, the heater 93 is arranged outside the vacuum chamber 91. The heater 93 is driven by a driving device such as a triaxial robot not shown operable in the horizontal XY direction and the vertical Z direction. The heater 93 has a driving source 94 and a beam irradiating device 95 connected to the driving source 94. The beam irradiating device 95 irradiates a laser beam or a high-temperature optical beam of a large capacity to the cover 92 of the vacuum chamber 91.

In this configuration, the heater 93 is moved for positioning relative to the vacuum chamber 91 as shown in FIG. 14, and the driving device 94 is driven to irradiate, for example, a laser beam from the beam irradiating device 95. The beam is irradiated onto the sealing material 59 through the transparent cover 92 to heat and melt the sealing material 59.

In this process, a spot of the laser beam at a position of the sealing material 59 is preferable to have a diameter from 0.8 to 1.5 times a diameter of the spherical metal alloy 59. If the spot diameter is less than 0.8 times a diameter of the spherical metal alloy 59, energy of the laser beam is concentrated to a center of the sealing material 59 and a part of the molten sealing material 59 is dropped into the housing through the opening 58. If the spot diameter is larger than 1.5 times a diameter of the spherical metal alloy 59, the laser beam impinges a ceramic portion around the opening 59 and the ceramic portion is damaged. As a result, undesirable dusts are generated, an atmosphere around the opening 58 is polluted by the dusts and it is difficult to seal the piezoelectric device in highly reliable state. The sealing material 59 is thus heated and melted, and the resulting molten metal blocks off the throughhole 76 of the opening section 58 as shown in FIG. 20, thereby conducting the second sealing operation in the vacuum atmosphere.

The sealing material 59 may therefore be melted by heating only the sealing material 59 without heating the metal coating portion 74a or the metal portion 75.

Figure 15:
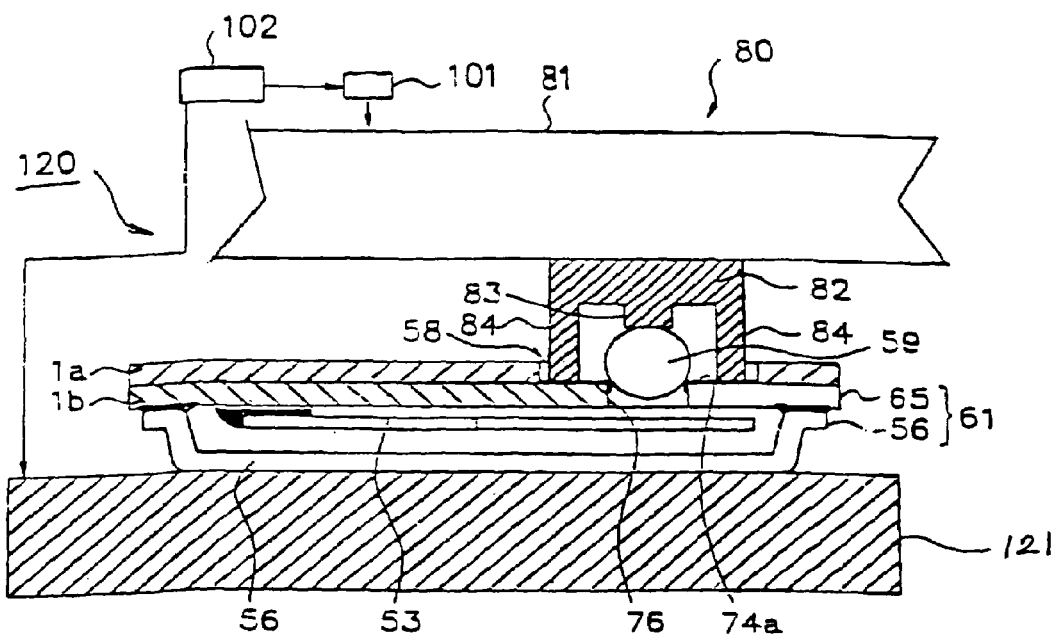
FIG. 15 is a descriptive view illustrating another example of the second sealing step of the piezo-electric resonator shown in FIGS. 7(a)–(b).

FIG. 15 shows a vacuum-sealing device 120 for achieving the second vacuum-sealing step described above.

The components of this vacuum-sealing device 120 corresponding to those in the vacuum-sealing device 100 described in the FIG. 13 are assigned the same reference numerals, and description which would be a duplication is omitted here. As compared with the vacuum-sealing device 100 described in the FIG. 13, the vacuum-sealing device 120 is different from the vacuum-sealing device 100 in that a second heater 121 is positioned so as to contact with the lid 56 of housing 61, and a heat controller 102 is connected to the heat source 101 and the second heater 121. The second heater 121 may be composed of a heater block like as a carbon heater for heat source itself. In this case, the heat source 101 and the heat conductor 81 consists of a same unit.

Figure 16:
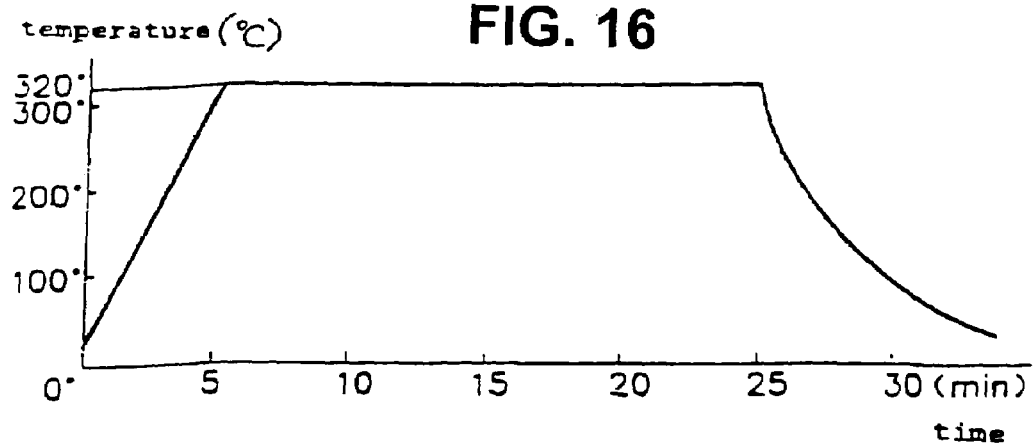
FIG. 16 is a graph chart illustrating a heating profile of the first heater of the second sealing step of the piezo-electric resonator shown in FIG. 15.

The second vacuum-sealing step can be achieved by using the vacuum-sealing device 120 for heating the housing 61 under the-melting point temperature of the sealing material 59. Concretely, the vacuum-sealing step is achieved by such heating step as shown in FIGS. 16 and 17.

First, the contact jig 82 is held above the sealing material 59, and the first pin 83 and the second pins 84 are not in contact with the sealing material 59. This configuration is different from the embodiment shown in the FIG. 15. Then, the heat controller 102 heats the housing 61 for driving the second heater 121. The heat from the second heater 121 is conducted to the sealing material 59 in contact with the housing 61, and the sealing material 59 is heated up to 200° C. or so as shown in the FIG. 17. In this case, the heat controller 102 may receive heating temperature information from measuring the temperature of the sealing material 59, or from the heating time and heating-up speed based on the data which was previously obtained by experiment. It is preferable that the heating time of the housing 61 is between 5 and 10 minutes, before the heating and melting of the sealing material 59. If the time is set such range, harmful gas produced from the sealing material 57 or the adhesive material 55 of the lid 56 shown in FIG. 7(b) can be removed from the housing by vacuum-sealing. FIG. 18 shows a vacuum profile of the vacuum-sealing process.

In contrast, the heat controller 102 drives the heat source 101 so that the heat conductor 81 is heated, the heat is conducted to the contact jig 82, and the contact jig 82 (first heater) is heated up to the temperature such as 320° C. (see FIG. 16).

Then, for example, when the temperature of the sealing material 59 reaches 200° C. and the temperature of the contact jig 82 reaches 320° C., a driving device (not shown) drives the contact jig 82 down and in the position shown in FIG. 15.

Figure 17A:
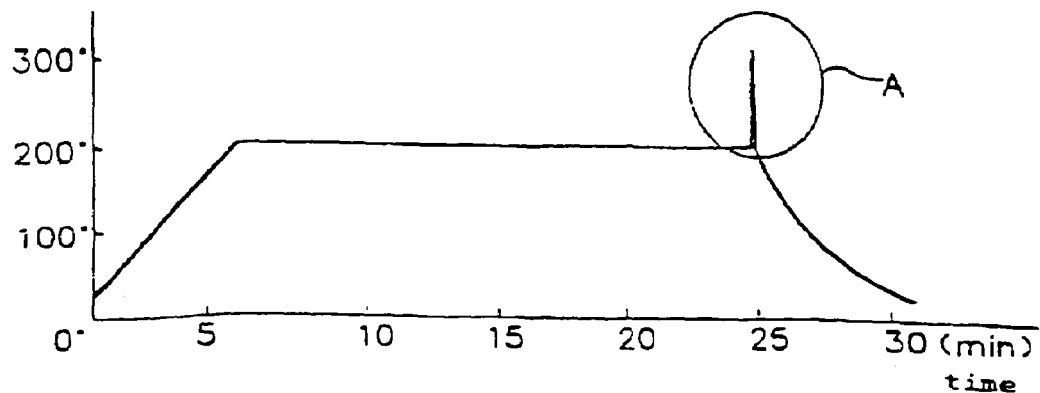
FIGS. 17(a)–(b) are graph charts illustrating a heating profile of the second heater of the second sealing step of the piezo-electric resonator shown in FIG. 15.
Figure 18:
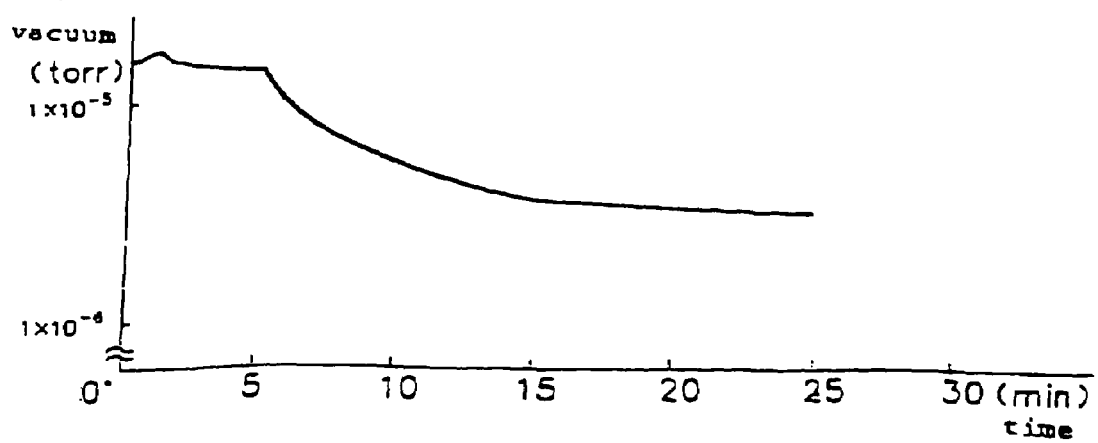
FIG. 18 is a graph chart illustrating a vacuum process profile of second sealing step of the piezo-electric resonator shown in FIG. 15.

That is to say, the first pin 83 of the contact jig 82 contacts near the center of the sealing material 59, and the second pins 84 contacts metal coating 74a and/or metal portion 75 shown in FIG. 10(b), therefore, the temperature of the sealing material 59 rises rapidly and reaches over the melting point of the sealing material 59 shown as symbol A of FIG. 17(a). It is desirable that the temperature rising time is shorter, preferably equal or less that 10 seconds, more preferably equal or less than 3 or 5 seconds, and the best result is obtained when the rising time is 1.5 seconds.

Figure 17B:

With regard to the temperature rising time of the sealing material 59, FIG. 17(b) shows enlarged view of the portion of symbol A of the FIG. 17(a). It is understood by this figure that at the rising portion A1, the change in temperature is steep, at the descending portion A2, the change in temperature is a little slow.

In this case, the temperature of the sealing material is risen up to 200° C. as described above for keeping the temperature of housing 61 under the melting point of the sealing material 59, by using Au—Sn soldering alloy for the sealing material, for example. However, it can be a high heating temperature when the melting point is higher, or a low heating temperature when melting point is lower, by the characteristic of the sealing material 59. However, it is not desirable that the heating temperature of the housing 61 rise higher than 240° C. because harmful gas may be produced from melting the sealing material 57 or the adhesive material 55 of lid 56 shown in FIG. 7(b).

As described above, the sealing material 59 is melted and can easily flow to surrounding the opening 58 when melting the sealing material after pre-heating the housing 61 under the melting point of the sealing material 59 using the vacuum-sealing device 120 as shown in the FIG. 15. Accordingly, stable sealing of the housing 61 is accomplished.

Furthermore, high vacuum condition in the housing 61 is achieved by heating and melting of the sealing material 59 instantaneously when heating the sealing material 59 rapidly after pre-heating the housing 61 under the melting point of the sealing material 59. However, it is not desirable that the heating time is longer than 1 minute, for example, because a harmful gas may be produced from melting the sealing material 57 or the adhesive material 55 of lid 56. Accordingly, it is desirable that the heating time is shorter in due consideration of the required time for melting the sealing material 59.

Figure 19:
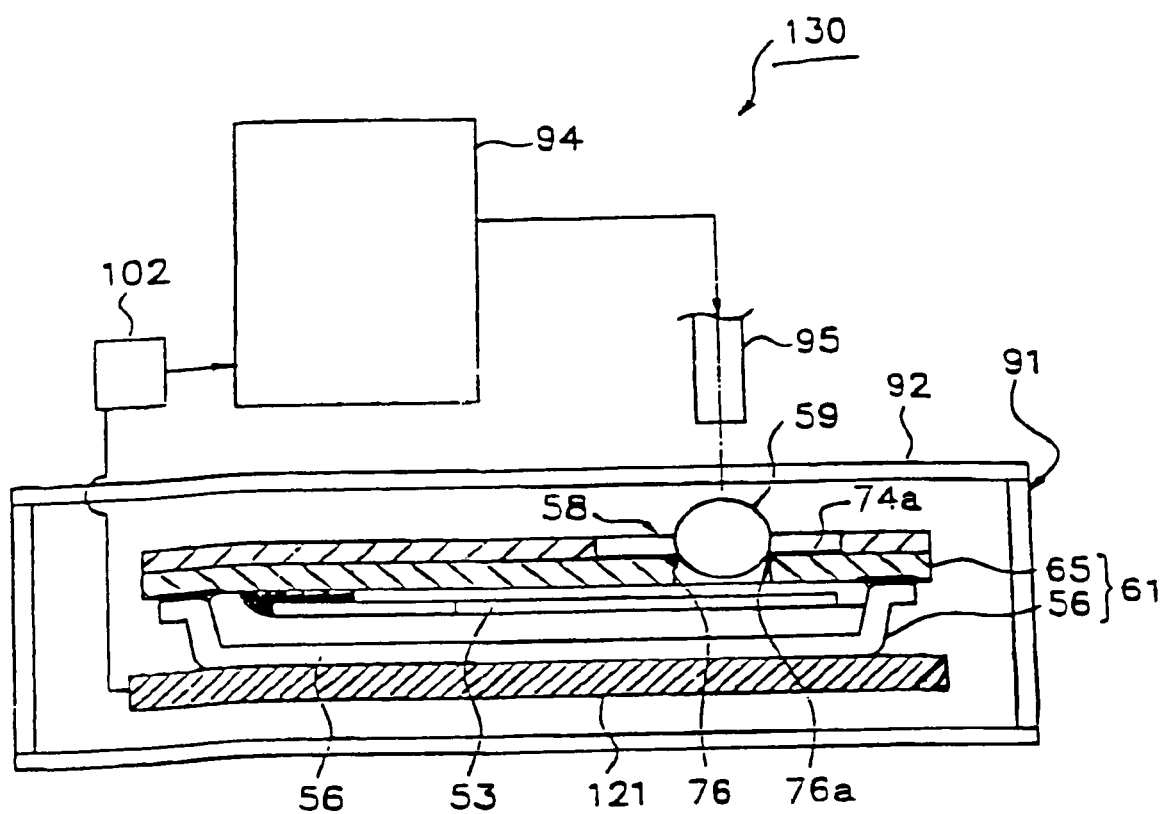
FIG. 19 is a descriptive view illustrating another example of the second sealing step of the piezo-electric resonator shown in FIGS. 7(a)–(b).

FIG. 19 shows a vacuum-sealing device 130 as another embodiment of second vacuum-sealing step as described above.

The components of this vacuum-sealing device 130 corresponding to those in the vacuum-sealing device 110 described in the FIG. 14 are assigned the same reference numerals, and description which would be a duplication is omitted here. As compared with the vacuum-sealing device 110 described in FIG. 14, the vacuum-sealing device 130 is different from the vacuum-sealing device 110 in that a second heater 121 is positioned so as to be in contact with the lid 56 of housing 61, and a heat controller 102 is connected to a drive source 94 and the second heater 121.

This embodiment of the vacuum-sealing device 130 can provide an additional advantage to the advantages of the vacuum-sealing device 110 described in the FIG. 14 in that the sealing material 59 is melted and can easily flow to surrounding the opening 58, and thus stable sealing of the housing 61 is accomplished.

The shape and the arrangement of the metal portion is not limited to those of the above-mentioned embodiment, but can be set freely within a range not impairing strength of the base 65.

As described above, it is not always necessary to provide both the metal coating 74a and the metal portion 75. It suffices to provide either one thereof.

An electrode pattern electrically connected to the metallized portion of the opening section or the metal portion 75 may be wired as an extension over the side of the housing 61.

Sixth Embodiment

Figure 21:
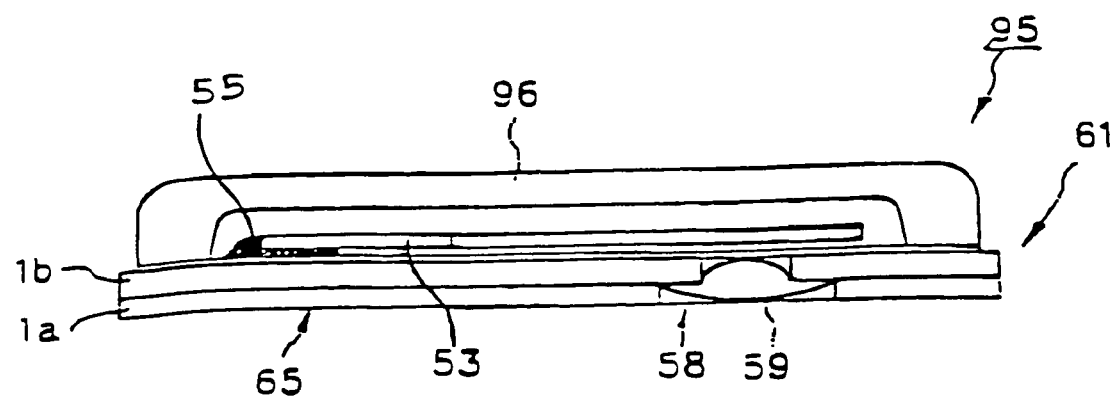
FIG. 21 is a schematic sectional front view illustrating a piezo-electric resonator of a sixth embodiment of the invention.

FIG. 21 illustrates a piezo-electric resonator 95 of a sixth embodiment of the invention. The components of this piezo-electric resonator 95 corresponding to those in the fifth embodiment are assigned the same reference numerals, and the description leading to duplication is omitted here. The piezo-electric resonator 95 is different from that in the fifth embodiment in that a ceramic lid 96 is used in place of the metal lid 56 shown in FIG. 7(b). The piezo-electric resonator 95 of the sixth embodiment can therefore provide the same advantages as in the fifth embodiment.

Seventh Embodiment

Figure 22:
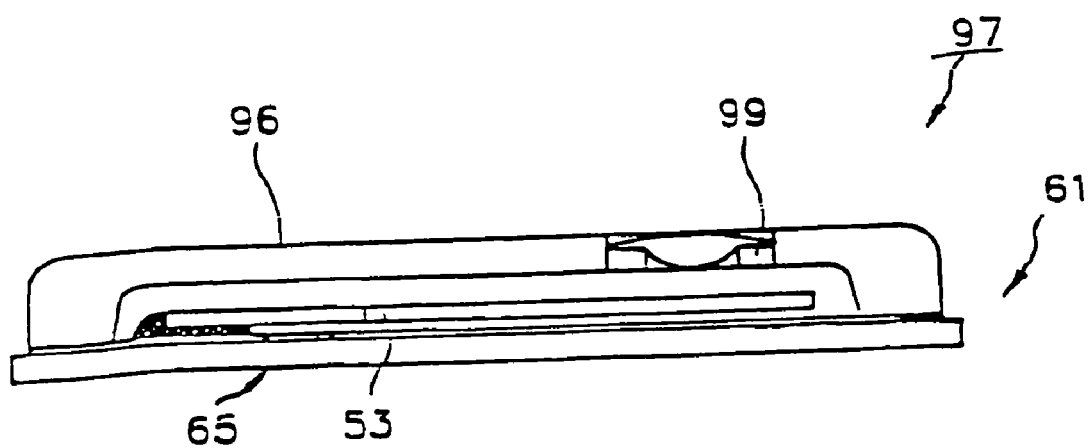
FIG. 22 is a schematic sectional front view illustrating a piezo-electric resonator of a seventh embodiment of the invention.

FIG. 22 illustrates a piezo-electric resonator 97 of a seventh embodiment of the invention. The components of this piezo-electric resonator 97 corresponding to those in the fifth embodiment are assigned the same reference numerals, and the description leading to duplication is omitted here. The piezo-electric resonator 97 is different from that in the sixth embodiment in that the opening 99 is formed in the lid 96 shown in FIG. 21. The piezo-electric resonator 97 of the seventh embodiment can therefore provide the same advantages as in the fifth and the sixth embodiments.

Eight Embodiment

Figure 23A:
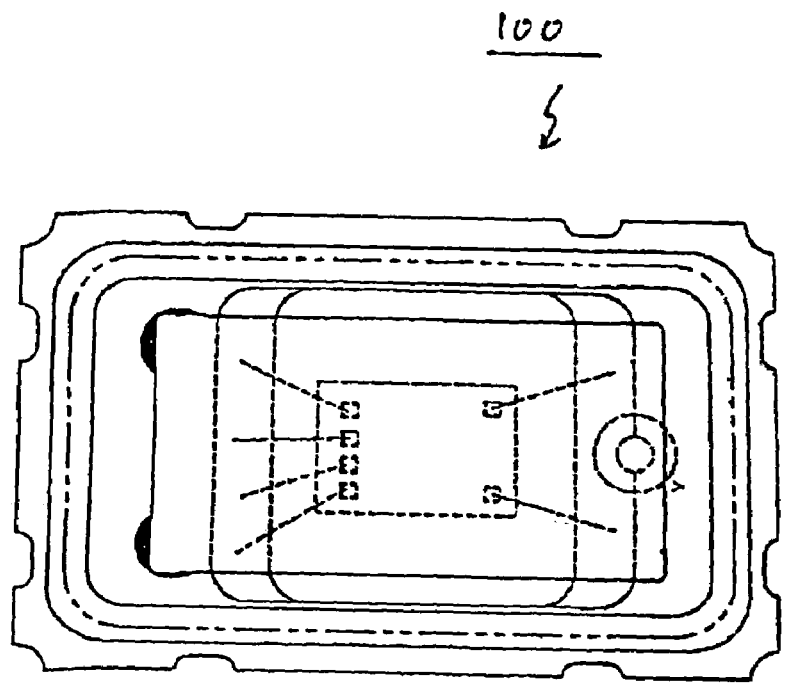
FIG. 23(a) is a plan view of a piezo-electric oscillator of an eighth embodiment of the invention.
Figure 23B:
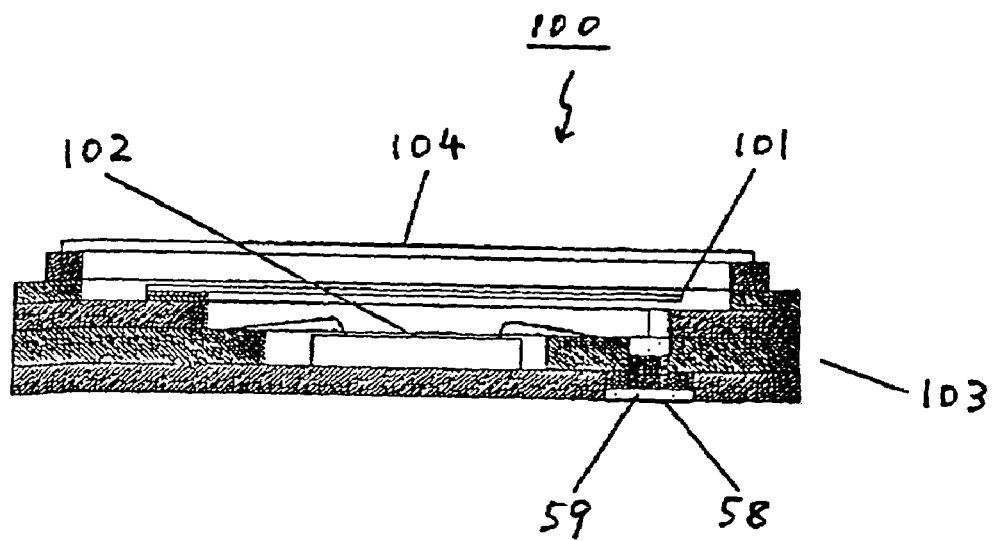
FIG. 23(b) is a schematic sectional view of piezo-electric oscillator of an eighth embodiment of the invention.
Figure 24:
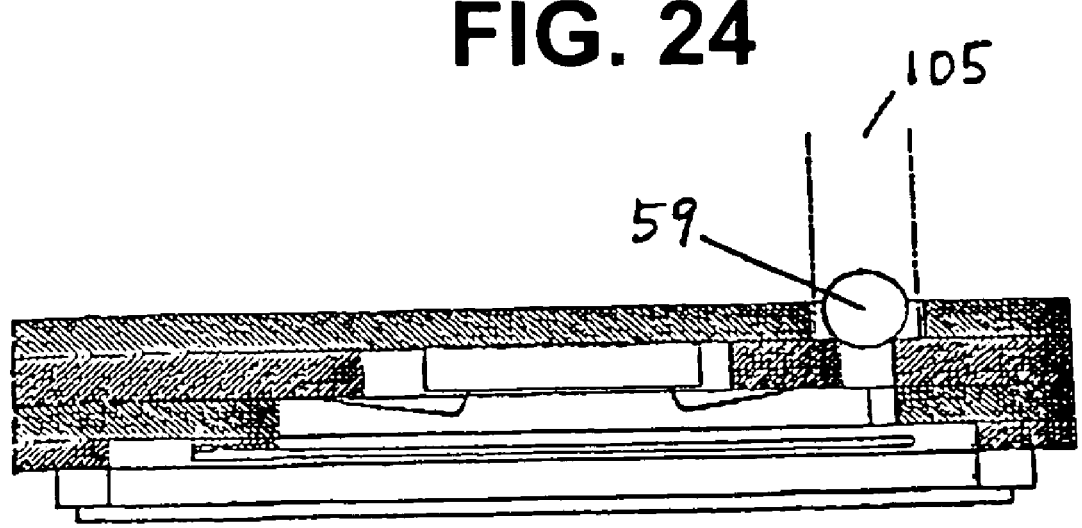
FIG. 24 illustrates a second sealing step of a method of forming a piezo-electric oscillator of an eighth embodiment of the invention.

FIG. 23 illustrates a piezoelectric oscillator 100 including a rectangular AT cut quartz crystal resonator element 101 and an IC chip 102 having an oscillation circuit. The IC chip 102 is mounted on a base 103 formed by a ceramic laminated substrate and the rectangular AT cut quartz crystal resonator element 101 is mounted above the IC chip 102. After the metal lid 104 is sealed on the base 103, the opening 58 is sealed by a spherical metal alloy 59 in vacuum. FIG. 24 illustrates a second sealing step. In this second sealing step, a spot of the laser beam at a position of the sealing material 59 is preferable to have a diameter from 0.8 to 1.5 times a diameter of the spherical metal alloy 59. If the spot diameter is less than 0.8 times a diameter of the spherical metal alloy 59, energy of the laser beam is concentrated to a center of the sealing material 59 and a part of the molten sealing material 59 is dropped into the housing through the opening 58. If the spot diameter is larger than 1.5 times a diameter of the spherical metal alloy 59, the laser beam impinges a ceramic portion around the opening 58 and the ceramic portion is damaged. As a result, undesirable dusts are generated, an atmosphere around the opening 58 is polluted by the dusts and it is difficult to seal the piezoelectric device in highly reliable state.

The present invention is not limited to these embodiments, but components may be freely combined.

The sealing material 57 may consist of an Au—Sn, a Sn, a Pb—Sn or an Ag brazing metal material, or an organic adhesive. The sealing material 57 may take a clad or preformed shape.

According to the above-mentioned configuration, it is possible to perform the first sealing step, the frequency adjusting step and the second sealing step commonly in a laser device or an electron beam device, thus permitting integrated fabrication in a device.

The ceramic base 65 and the lid 56 may be in the form of a single product, or in a plate form having a plurality of products arranged thereon.

The configuration of the present invention is applicable also to a crystal oscillator incorporating an IC chip having an oscillation circuit and a crystal resonator unit in a housing thereof, or to a real-time clock oscillator.

By using ceramics or a metal, which is low in cost as compared with high-quality glass, for components, there is available a compact and thin quartz resonator (piezo-electric resonator) having a size of 5 mm long×2 mm wide×0.8 mm thick at a low cost.

According to the present invention, by adjusting the frequency of the piezoelectric resonator by a frequency adjuster through the opening provided in the housing, it is possible to form a base and a lid composing a vacuum-sealed housing from low-cost materials, and therefore to provide a surface-mounting type quartz resonator at a low cost.

According to the present invention, by adjusting the frequency by using a part of at least one resonating arm of a tuning fork type resonator element, it is possible to perform the stable frequency adjustment operation.

According to the present invention, when using a tuning fork type piezoelectric resonator element, it is possible to adjust the frequency in good balance between the two resonating arms.

In these inventions, as described above, it is possible to reduce the size of the opening for frequency adjustment, and to prevent occurrence of the effect of sealing the opening on the quartz resonator element. By conducting frequency adjustment within a fine range, there is available an advantage of providing a compact and thin piezo-electric resonator having stable properties.

According to the present invention, in which the air-tight region incorporating the piezo-electric resonator element and being vacuum-sealed is formed of a base and a lid consisting of single layers, there is available a very high air-tightness and it is possible to provide a high-quality piezo-electric resonator at a low cost.

According to the present invention, the first sealing step, the frequency adjusting step and the second vacuum-sealing step can be performed with a laser beam or an electronic beam, thus providing an advantage of permitting integrated fabrication in a single device and achieving a low manufacturing cost.

According to the present invention, by arranging metallized elements around the opening provided in the housing in a piezo-electric resonator having the housing incorporating the piezo-electric resonator, heat produced upon sealing can be effectively conducted to the sealed portion, thus permitting achievement of a very high degree of vacuum. There is therefore available a high-quality piezo-electric resonator in which the incorporated piezo-electric resonator element stably oscillates.

According to the present invention, by heating the metallized portion farmed around the opening, it is possible to directly heat the opening formed of tine holes. It is therefore possible to instantaneously accomplish highly reliable vacuum-sealing. Because heat is not directly conducted to portions other than the portion to be sealed, heating effect particularly on the mounting portion of the piezo-electric resonator element is eliminated, and there is available a piezo-electric resonator of a high precision free from deviation of frequency after sealing.

According to the present invention, it is possible to prevent heat damage to the resonator element and the adhesive material.

According to the present invention, the sealing material for sealing the opening is a spherical alloy having a melting point within a range of from 250 to 500° C. It is thus possible to perform sealing at a low temperature and with instantaneously highly reliable vacuum. Since the alloy takes the form of very small spheres (ball-shaped) having a diameter of from 0.3 to 0.4 mm, fabrication of the sealing material is easy and the material is manufacturable at a low cost.

According to the present invention, the housing opening is formed into a circular or elliptic shape, and the sealing material for sealing the opening is formed into a ball shape. One or a plurality of sealing material can therefore easily be applied matching the shape of the opening, and the heating and sealing operation is easier.

According to the present invention, the frequency adjusting step and the vacuum-sealing step can be accurately carried out with the use of common irradiating device such as a laser device or an electron beam device.

What is claimed is:

1. A piezoelectric element, comprising:
    a package in which at least a piece of the piezoelectric element is internalized, and the package including a base;
    a first ceramic substrate having a first through hole;
    a second ceramic substrate having a second through hole whose diameter is smaller than that of the first through hole, wherein the base is formed by the first and second ceramic substrate so that the first ceramic substrate faces outside of the package while the second ceramic substrate faces inside of the package; and
    a step portion formed by and between the first and second substrates; and
    a metal film covering the step so as to extend to inside of the second through hole without reaching an opposite side of the second ceramic substrate from the step portion, wherein an opening formed by the through holes is sealed by melting a sealing material.

2. The piezoelectric element according to claim 1, wherein the metal film is thicker at a peripheral of the second through hole.

3. The piezoelectric element according to claim 1, wherein the sealing material is an alloy whose melting point is between 250° C. and 500° C.

4. The piezoelectric element according to claim 1, wherein the sealing material is selected from a group consisting of An—Sn solder alloy, Sn solder alloy, Pb—Sn solder alloy and a combination thereof.

5. The piezoelectric element according to claim 1, wherein the sealing material is an alloy that includes Ag and Cu.

6. The piezoelectric material according to claim 1, wherein the second through hole is a circle and the sealing material is a spherical shaped alloy.

7. The piezoelectric element according to claim 6, wherein the sealing material has a diameter which is 1.1 to 1.3 times larger than the diameter of the opening.

* * * * *